(12) United States Patent
Casavant

(10) Patent No.: US 7,111,259 B2
(45) Date of Patent: *Sep. 19, 2006

(54) CROSSTALK MITIGATION METHOD AND SYSTEM

(76) Inventor: Albert E. Casavant, 80 Ridgeview Dr., Belle Meade, NJ (US) 08502

( * ) Notice: Subject to any disclaimer, the term of this patent is extended or adjusted under 35 U.S.C. 154(b) by 22 days.

This patent is subject to a terminal disclaimer.

(21) Appl. No.: 10/457,563

(22) Filed: Jun. 10, 2003

(65) Prior Publication Data

US 2003/0229873 A1 Dec. 11, 2003

Related U.S. Application Data

(62) Division of application No. 09/977,372, filed on Oct. 16, 2001, now Pat. No. 6,637,014.

(60) Provisional application No. 60/273,344, filed on Mar. 6, 2001.

(51) Int. Cl.
*G06F 17/50* (2006.01)
(52) U.S. Cl. .............................................. 716/6; 716/5
(58) Field of Classification Search ............. 716/1–10; 703/13–15, 19
See application file for complete search history.

(56) References Cited

U.S. PATENT DOCUMENTS

| 5,568,395 | A | * | 10/1996 | Huang | 716/4 |
|---|---|---|---|---|---|
| 5,983,006 | A | | 11/1999 | Carlson et al. | |
| 6,058,256 | A | * | 5/2000 | Mellen et al. | 716/12 |
| 6,128,769 | A | | 10/2000 | Carlson et al. | |
| 6,263,478 | B1 | | 7/2001 | Hahn et al. | |
| 6,353,917 | B1 | * | 3/2002 | Muddu et al. | 716/6 |
| 6,389,581 | B1 | | 5/2002 | Muddu et al. | |
| 6,434,731 | B1 | * | 8/2002 | Brennan et al. | 716/10 |
| 6,449,753 | B1 | * | 9/2002 | Aingaran et al. | 716/5 |
| 6,499,131 | B1 | * | 12/2002 | Savithri et al. | 716/5 |
| 6,507,935 | B1 | * | 1/2003 | Aingaran et al. | 716/5 |
| 6,532,574 | B1 | * | 3/2003 | Durham et al. | 716/6 |
| 6,587,815 | B1 | * | 7/2003 | Aingaran et al. | 703/13 |
| 6,594,805 | B1 | * | 7/2003 | Tetelbaum et al. | 716/5 |

OTHER PUBLICATIONS

R. Arunachalam, K. Rajagopal and L. T. Pileggi, "TACO: Timing Analysis With Coupling," ACM/IEEE Design Automation Conference, (DAC2000), pp. 266-269.

Y. Cao, T. Sato, X. Huang, C. Hu, and D. Sylvester, "New Approaches to Noise-Aware Static Timing Analysis," ACM/IEEE International Workshop on Timing Issues in the Specification and Synthesis of Digital Systems (TAU2000), pp. 8-13.

(Continued)

*Primary Examiner*—Vuthe Siek
*Assistant Examiner*—Binh Tat

(57) ABSTRACT

A method and system of crosstalk mitigation in integrated circuits employs delay change curves (DCCs) and uses targeted transistor sizing and/or buffer insertion. Based on a timing graph, a longest path capable of being shortened may be shortened by victim strengthening or aggressor weakening when a setup requirement time violation occurs and the path is capable of being shortened. The process is repeated based on an updated timing graph until the longest path is not capable of being further shortened, or there is no setup requirement time violation. Additionally, the path may be lengthened where a hold requirement time violation has occurred and the path is capable of being lengthened, by victim strengthening or aggressor weakening, until the path cannot be further lengthened or there is no hold requirement time violation. Victim strengthening is performed by altering the critical path, and aggressor weakening is performed by altering the non-critical path.

5 Claims, 51 Drawing Sheets

OTHER PUBLICATIONS

A. Devgan, "Efficient Coupled Noise Estimation for On-Chip Interconnects," IEEE/ACM International Conference on Computer-Aided Design, (ICCAD97), pp. 147-151.

T. Xiao and M. Marek-Sadowska, "Worst Delay Estimation in Crosstalk Aware Static Timing Analysis," Proceedings of International Conference on Computer Design, (ICCD2000), pp. 115-120.

T. Xiao, C.-W. Chang, M. Marek-Sadowska, "Efficient Static Timing Analysis in Presence of Crosstalk," 13th Annual International ASIC/SOC Conference, 2000, pp. 335-339.

P.F. Tehrani, S.W. Chyou, U. Ekambaram, "Deep Sub-Micron Static Timing Analysis in Presence of Crosstalk," IEEE 1st International Symposium on Quality Electronic Design, (ISQED2000), pp. 505-512.

S. Sapatnekar, "Capturing the Effect of Crosstalk on Delay," 13th International Conference on VLSI Design, Jan. 2000, pp. 364-369.

T. Sato, D. Sylvester, Y. Cao, and C. Hu, Accurate In-situ Measurement of Peak Noise and Signal Delay Induced by Interconnect Coupling, IEEE International Solid-State Circuits Conference, (ISSCC2000), pp. 226-227.

Y. Sasaki and K. Yano, "Multi-Aggressor Relative Window Method for Timing Analysis Including Crosstalk Delay Degradation," IEEE Custom Integrated Circuits Conference, (CICC2000), pp. 495-498.

Y. Sasaki and G. De Micheli, "Crosstalk Delay Analysis using Relative Window Method," 12th Annual International ASIC/SOC Conference, 1999, pp. 9-13.

P. Rezvani, A.H. Ajami, M. Pedram, and H. Savoj, "LEOPARD: A Logical Effort-based fanout Optimizer for Area and Delay," IEEE/ACM International Conference on Computer-Aided Design, (ICCAD99), pp. 516-519.

P.D. Gross, R. Arunachalam, K. Rajogopal, and L.T. Pileggi, "Determation of Worst-Case Aggressor Alignment for Delay Calculation," IEEE/ACM International Conference on Computer-Aided Design, (ICCAD98), pp. 212-219.

L.P.P.P. van Ginneken, "Buffer Placement in Distributed RC-tree Networks for Minimal Elmore Delay," IEEE International Symposium on Circuits and Systems, (ISCS90), pp. 865-868.

T. Xiao and M. Marek-Sadowska, "Efficient Delay Calculation in Presence of Crosstalk," Proceedings of 1st International Symposium on Quality Electronic Design, (ISQED2000), pp. 491-497.

B. Franzini, C. Forzan, D. Pandini, P. Scandolara, A. Dal Fabbro, "Crosstalk Aware Static Timing Analysis: a Two Step Approach," IEEE 1st International Symposium on Quality Electronic Design, (ISQED2000), pp. 499-503.

Y. Eo, W.R. Eistenstadt, J.Y. Jeong and O.-K. Kwon, "A New On-Chip Interconnect Crosstalk Model and Experimental Verification for CMOS VLSI Circuit Design," IEEE Transactions on Electron Devices, vol. 47, No. 1, Jan. 2000.

A. Devgan, "Efficient Coupled Noise Estimation for On-Chip Interconnects," IEEE/ACM International Conference on Computer-Aided Design, (ICCAD97), pp. 147-151.

J. Cong, D.Z. Pan and P.V. Srinivas, "Improved Crosstalk Modeling of Noise Constrained Interconnect Optimization," ACM/IEEE International Workshop on Timing Issues in the Specification and Synthesis of Digital Systems, (TAU2000), pp. 14-20.

S. Sirichotiyakul, D. Blaauw, R. Levy, C. Oh, S. Shams, V. Zolotov and J. Zuo, "Driver Modeling and Alignment for Worst-Case Delay Noise." ACM/IEEE International Workshop on Timing Issues in the Specification and Synthesis of Digital Systems, (TAU2000), pp. 1-7.

\* cited by examiner

| | |
|---|---|
| Strength change effect: | NA |
| Movement effect: | slowdown ⇑, LAT ⇑ if remain in Case 4; slowdown constant, no additional LAT change if continue to Case 3; slowdown ⇓, LAT ⇓ if continue to Case 2,1 |
| Intermediate effect: | NA |
| Environmental effect: | slowdown ⇓, LAT ⇓ if remain in Case 4 or continue to Case 5 |
| BM remedy: | bypass to Case 2,1 to balance or "trace" |
| Environmental remedy: | no remedy needed |

| | αA | | EREM | αV | | EREM | βA | | EREM | βV | | EREM | REMEDIES |
|---|---|---|---|---|---|---|---|---|---|---|---|---|---|
| | | | NREM | | | NREM | | | NREM | | | NREM | |
| Incl. Cases | | | | | | | | | | | | | |
| Case 2 <-A | 1 | [NV,m] | N/A | [DA,I] | NRN | [NV,m][NV,e] | NRN / NRN | [DA,I][DA,e] | NRN | | NRN | Slowdown ⇓, LAT ⇓ if remain (continue to) Case 2 (,1) or continue to Case 1 |
| Case 2 <-V | 3,4,5 | [DV,I] | N/A | [NA,m] | NRN | [UV,I] [no UV,e] | NRN / NRN | [NA,m][UA,I] [NA,e][UA,e] | NRN | | NRN | Slowdown ⇑, LAT ⇓ (SAN) if remain (continue to) Case 2 |
| Case 3 <-A | 2,1 | [NV,m] | N/A | [DA,I] | NRN | [DV,I][DV,e] | NRN / NRN | [DA,I][DA,e] | NRN | | NRN | Slowdown constant, LAT constant (no additional LAT change) if remain in (continue to) Case 3 |
| Case 3 <-V | 4,5 | [DV,I] | N/A | [NA,m] | NRN | [NV,m][NV,e] | NRN / NRN | [NA,e][UA,I] [UA,e] | NRN | | NRN | Slowdown constant, no additional LAT change if remain in (continue to) Case 3 |
| Case 4 A-> | 5 | | | [DA,I] | | [UV,I] [UV,e] | NRN / N/A | [NA,e2] [DA,I] [UA,e2] | NRN | | NRN | Slowdown ⇓, LAT ⇓ if remain in (continue to) Case 4 (,5) or continue to Case 5 |
| Case 4 <-A | 3,2,1 | [NV,m] | N/A | | | [NV,m] | NRN / B,Y | | | | | Slowdown ⇓, LAT ⇑ if remain in Case 4 |
| Case 4 <-V | 5 | [DV,I] | N/A | [NA,m] | NRN | [DV,I][DV,e2] | NRN / NRN | [NA,m] [NA,e1] [DA,I] [UA,e1] | NRN | | NRN | Slowdown ⇓, LAT ⇓ if remain in (continue to) Case 4 (,5) or continue to Case 5 |

| | αA | | | αV | | | βA | | | βV | | | REMEDIES |
|---|---|---|---|---|---|---|---|---|---|---|---|---|---|---|
| | | NREM | EREM | | NREM | EREM | | NREM | EREM | | NREM | EREM | | |
| Incl. Cases | | | | | | | | | | | | | | |
| A-> | 1 | [NV,m] | N R N | N A | [DA,i] | N R N | N A | [NV,i][NV,e] | N R N | N A N | [DA,i][DA,e] | N R N | N R N | Speedup ⇓, EAT ⇑ if remain in (continue to) Case 2(,1) or continue to Case 1 |
| V-> | 3 4 5 | [DV,i] | N R N | N A | [NA,m] | N R N | N A | [UV,i] [no UV,e] / [DV,i][DV,e] | N R N N R N | N A N R N | [NA,m] [NA,e][UA,i] [UA,e] | N R N | N R N | Speedup ⇑, EAT constant (no additional EAT change) (SAN) if remain in Case 2 |
| A-> | 2 1 | [NV,m] | N R N | N A | [DA,i] | N R N | N A | [NV,i][NV,e] | N R N | N A N | [DA,i][DA,e] | N R N | N R N | Speedup constant, EAT constant (no additional EAT change) if remain in (continue to) Case 3 |
| V-> | 4 5 | [DV,i] | N R N | N A | [NA,m] | N R N | N A | [UV,i] [no UV,e] / [DV,i][DV,e] | N R N N R N | N A N R N | [NA,m] [NA,e][UA,i] [UA,e] | N R N | N R N | Speedup constant, EAT constant (no additional EAT change) if remain in (continue to) Case 3 |
| A-> | 3 2 1 | [NV,m] | N R N (BY) | N A | | N R N | | [NV,m] | N R N | N A N | [DA,i][DA,e1] [UA,e2] | N R N | N R N | Speedup ⇑, EAT ⇓ if remain in Case 4 |
| <-A | | | | | [DA,i] | N R N | N A | [NV,e][DV,e2] | N R N | N A | [DA,i][DA,e1] [UA,e2] | N R N | N R N | Speedup ⇓, EAT ⇑ if remain in (continue to) Case 4 or continue to Case 5 |
| V-> | 5 | [DV,i] | N R N | N A | [NA,m] | N R N | N A | [UV,i] [no UV,e] / [DV,i][DV,e1] | N R N | N A N R N | [NA,m][NA,e] [DA,e2] [UA,e1] | N R N | N R N | Speedup ⇓, EAT ⇑ if remain in (continue to) Case 4(,5) or continue to Case 5 |

Case 2 | Case 3 | Case 4

FIGURE 25

| Types of movement | | Extended cases | |
|---|---|---|---|
| m | = normal movement | A | = aggressor |
| i | = intermediate movement | V | = victim |
| e (e1) (e2) | = environmental movement | | |
| Extended cases | | Remedies | |
| N | = no tracking | COK | = conditionally OK |
| | | CBY | = conditionally bypass or trace |
| U | = upstream tracking | BY | = bypass or trace |
| D | = downstream tracking | NRN | = no remedy needed |
| | | NR | = no remedy possible |
| | | NA | = not available |

FIGURE 26

```
Mitigate_Crosstalk (Timing_Graph)
BEGIN
    (LAT_longest_paths, EAT_shortest_paths) = Find_Longest_&_Shortest_Paths (Timing_Graph)
    found_longest_path_shortening = TRUE
    setup_violation = Find_Setup_Violation (LAT_longest_paths)
    WHILE setup_violation && found_longest_path_shortening DO
        found_longest_path_shortening = Look_For_α (STRENGTHEN_VICTIM, SETUP)
        IF NOT found_longest_path_shortening
            found_longest_path_shortening = Look_For_α (WEAKEN_AGGRESSOR, SETUP)
        IF found_longest_path_shortening
            (LAT_longest_paths, EAT_shortest_paths) = Find_Longest_&_Shortest_Paths (Timing_Graph)
            setup_violation = Find_Setup_Violation (LAT_longest_paths)
    END WHILE
    found_shortest_path_lengthening = TRUE
    hold_violation = Find_Hold_Violation (EAT_shortest_paths)
    WHILE hold_violation && found_shortest_path_lengthening
        found_shortest_path_lengthening = Look_For_α (STRENGTHEN_VICTIM, HOLD)
        IF NOT found_shortest_path_lengthening
            found_shortest_path_lengthening = Look_For_α (WEAKEN_AGGRESSOR, HOLD)
        IF found_shortest_path_lengthening
            (LAT_longest_paths, EAT_shortest_paths) = Find_Longest_&_Shortest_Paths (Timing_Graph)
            hold_violation = Find_Hold_Violation (EAT_shortest_paths)
    END WHILE
END
```

FIGURE 35

```
Look_For_α (strengthen_or_weaken, setup_or_hold)
BEGIN
    IF strengthen_or_weaken == STRENGTHEN_VICTIM
        movement_threshold = 0
    ELSE
        movement_threshold = LARGE_POSTIVE_NUMBER
    current_node = DOWNSTREAM_DUMMY_NODE
    DO
        IF upstream fan_in to current node
            current_node = Find_Upstream_Join (current_node)
        ELSE
            current_node = Next_Upstream_Critical_Path_Node (current_node)
        αv = Critical_Path_Edge_Whose_Source_Is (current_node)
        strength_change_possible = TRUE
        WHILE strength_change_possible DO
            (strength_change_possible, α, αa) = Find_Next_α_Strength (αa, αv,
                        strengthen_or_weaken, movement_threshold, setup_or_hold)
            /* strength change that gives movement above movement_threshold is determined */
            /* If strengthen_or_weaken == STRENGTHEN_VICTIM, Find_Next_α_Strength updates
               EAT, LAT of αv for movement resulting from strength change, α = αv */
            /* If strengthen_or_weaken == WEAKEN_AGGRESSOR, Find_Next_α_Strength chooses
               αa to weaken, updates EAT, LAT of αv for both strength change of αa and resulting
               movement, and EAT, LAT of αa for movement resulting from strength change, α = αa */
            IF strength_change_possible
                (β_proceed, movement_threshold) = Evaluate_α_As_Aggressor (α,
                                                        movement_threshold)
                IF β_proceed
                    (β_proceed, movement_threshold) = Evaluate_α_As_Victim (α,
                                                        movement_threshold)
                IF β_proceed && (strengthen_or_weaken == WEAKEN_AGGRESSOR)
                    (β_proceed, movement_threshold) = Evaluate_β_ Path (αa, setup_or_hold,
                                                        movement_threshold, stengthen_or_weaken)
                IF β_proceed
                    (β_proceed, movement_threshold) = Evaluate_β_ Path (αv, setup_or_hold,
                                                        movement_threshold, stengthen_or_weaken)
                IF β_succeed
                    RETURN (SUCCEED)
        END WHILE
        IF current_node == UPSTREAM_DUMMY_NODE
            RETURN (FAIL)
    END DO
END
```

FIGURE 36

Evaluate_α_As_Aggressor (α, movement_threshold)
BEGIN
    FOREACH victim of α
        IF Upstream_Victim (victim, α) || NOT Downstream_Victim (victim, α)
            /* Effect on downstream victim considered during victim analysis */
            Update_Victim_EAT_Dynamic_Delay (victim, α, ALPHA, 0)
            Update_Victim_LAT_Dynamic_Delay (victim, α, ALPHA, 0)
            IF All_Moving_Aggressors_For_This_Victim_Considered (victim)
                IF Overall_Delta_EAT_Not_Positive (victim) || Overall_Delta_LAT_Not_Negative (victim)
                    trace_ok = Trace (α, victim, 0)
                    IF NOT trace_ok
                        movement_threshold = Update_Movement_Threshold (victim, α_OR_β_AS_AGGRESSOR,
                                                    movement_threshold)
                    RETURN (FAIL, movement_threshold)
    ENDFOREACH
    RETURN (SUCCEED, movement_threshold)
END

FIGURE 37

```
Evaluate_α_As_Victim (α, movement_threshold)
BEGIN
    FOREACH aggressor to α
        IF NOT Downstream_Aggressor (α, aggressor)
            /* Downstream aggressor will never cause LAT to go up or EAT to go down so treat as an environmental effect */
            Update_Victim_EAT_Dynamic_Delay (α, aggressor, ALPHA, 0)
            Update_Victim_LAT_Dynamic_Delay (α, aggressor, ALPHA, 0)
            IF Overall_Delta_EAT_Not_Positive (victim) || Overall_Delta_LAT_Not_Negative (victim)
                trace_ok = Trace (α, α, 0)
                IF NOT trace_ok
                    movement_threshold = Update_Movement_Threshold (α, α_OR_β_AS_VICTIM, movement_threshold)
                    RETURN (FAIL, movement_threshold)
    RETURN (SUCCEED, movement_threshold)
END
```

FIGURE 38

```
Evaluate_β_Path (α, setup_or_hold, movement_threshold, strengthen_or_weaken)
BEGIN
  node_stack = NULL, current_node = Destination (α)
  current_edge = Next_Unexplored_(Secondary_First)_Edge (current_node)
  IF downstream_fanout from current_node
    Push_Node_Stack (current_node)
  DO
    (no_victim_bypass_needed, movement_threshold) = Evaluate_β_As_Victim (α, current_edge, movement_threshold,
                                                                          strengthen_or_weaken)
    IF NOT no_victim_bypass_needed
      RETURN (movement_threshold, FAIL)
    (no_aggressor_bypass_needed, movement_threshold) = Evaluate_β_As_Aggressor (α, current_edge,
                                                                                movement_threshold, strengthen_or_weaken)
    IF NOT no_aggressor_bypass_needed
      RETURN (movement_threshold, FAIL)
    current_node = Destination (current_edge)
    current_edge = Next_Unexplored_(Secondary_First)_Edge (current_node)
      /* If current_node == DUMMY_DOWNSTREAM_NODE then current_edge = NULL */
    IF downstream_fanout from current_node
      Push_Node_Stack (current_node)
    IF Slack_Terminate_Path (current_edge, setup_or_hold)
      current_edge = NULL
      /* two ways to get current_edge == NULL 1) current_node was DUMMY_DOWNSTREAM_NODE or 2)
      paths was slack_terminated */
    WHILE current_edge == NULL
      current_node = Pop_Node_Stack ()
      IF current_node != NULL
        current_edge = Next_Unexplored_(Secondary_First)_Edge (current_edge)
      ELSE RETURN (movement_threshold, SUCCEED)
        /* Only success can be all branches of path examined AND no failure up to that point */
    END WHILE
  END DO
END
```

FIGURE 39

```
Evaluate_β_As_Victim (α, victim, movement_threshold, strengthen_or_weaken)
BEGIN
    FOREACH aggressor to victim
        /* Downstream aggressor is treated as environmental effect */
        IF Upstream_Aggressor (victim, aggressor)
            IF Aggressor_Is_Alpha (aggressor, α)
                /* consider exact effect */
                one_of_aggressors_is_alpha = TRUE
                Update_Victim_EAT_Dynamic_Delay (victim, aggressor, ALPHA, 0)
                Update_Victim_LAT_Dynamic_Delay (victim, aggressor, ALPHA, 0)
            ELSE /* NOT Aggressor_Is_ALPHA (aggressor, α) */
                /* exact effect considering movement of aggressor */
                source_node_dynamic_EAT = Get_Dynamic_EAT (Source (aggressor))
                source_node_dynamic_LAT = Get_Dynamic_LAT (Source (aggressor))
                Update_Victim_EAT_Dynamic_Delay (victim, aggressor,
                    BETA, source_node_dynamic_EAT)
                Update_Victim_LAT_Dynamic_Delay (victim, aggressor,
                    BETA, source_node_dynamic_LAT)
        IF Fixed_Aggressor (victim, aggressor) || Aggressor_Analyzed (aggressor)
            /* consider effect assuming that aggressor will move same amount as α */
            Update_Victim_EAT_Dynamic_Delay (victim, aggressor, BETA, 0)
            Update_Victim_LAT_Dynamic_Delay (victim, aggressor, BETA, 0)
        IF Aggressor_Not_Yet_Analyzed (aggressor)
            α_total_movement_amount = Get_Movement (α)
            Update_Victim_EAT_Dynamic_Delay (current_edge,
                BETA, α_total_movement_amount)
            Update_Victim_LAT_Dynamic_Delay (current_edge,
                BETA, α_total_movement_amount)
    ENDFOREACH IF Overall_Delta_EAT_Not_Positive (victim) ||
            Overall_Delta_LAT_Not_Negative (victim)
        trace_ok = Trace (α, current_edge, 0)
        IF NOT trace_ok
            IF (one_of_aggressors_is_alpha && Bypassing_Wont_Help (victim))
                    || (strengthen_or_weaken == WEAKEN_AGGRESSOR)
                RETURN (FAIL, LARGE_POSITIVE_NUMBER)
            movement_threshold = Update_Movement_Threshold (victim,
                                        α_OR_β_AS_VICTIM,
                                        movement_threshold)
            RETURN (FAIL, movement_threshold)

RETURN (SUCCESS, movement_threshold)
END
```

FIGURE 40

```
Evaluate_β_As_Aggressor (α, aggressor, movement_threshold, strengthen_or_weaken)
BEGIN
    was_movement_update = FALSE
    FOREACH victim of aggressor
        IF Fixed_Victim
            /* If victim is in "will_be_analyzed" region or downstream on path, then victim analysis will handle effect. If victim
               was moving and already analyzed, treat as an environmental effect */
            Update_Victim_EAT_Dynamic_Delay (victim, aggressor, BETA, 0)
            Update_Victim_LAT_Dynamic_Delay (victim, aggressor, BETA, 0)
        IF All_Moving_Aggressors_For_This_Victim_Considered (victim)
            IF Overall_Delta_EAT_Not_Positive (victim) || Overall_Delta_LAT_Not_Negative (victim)
                trace_ok = Trace (α, victim, 0)
                IF NOT trace_ok
                    IF strengthen_or_weaken == VICTIM_STRENGTHEN
                        movement_threshold = Update_Movement_Threshold (victim, α_OR_β_AS_AGGRESSOR,
                                                                       movement_threshold)
                        was_movement_update = TRUE
                    ELSE
                        RETURN (FAIL, LARGE_POSITIVE_NUMBER)
    ENDFOREACH
    IF was_movement_update
        /* Any movement update means that strength must be changed to achieve bypassing */
        RETURN (FAIL, movement_threshold)
    RETURN (SUCCEED, movement_threshold)
END
```

FIGURE 41

```
Update_Victim_EAT_Dynamic_Delay (victim, aggressor, aggressor_type, common_movement)
BEGIN
    IF aggressor_type == ALPHA
        Update_EAT_DCC_Due_To_Strength_Change (victim, aggressor)
        /* can weaken or strengthen the aggressor */
        movement_amount = Movement_Due_to_Strength_Change_And_Movement (victim, aggressor)
    ELSE /* aggressor_type == BETA */
        movement_amount = Movement_Of_Source_node (aggressor)
    Update_EAT_Dynamic_Delay_Due_To_Movement (victim, movement_amount –
                                                      common_movement)
END Update_Victim_LAT_Dynamic_Delay (victim, aggressor, aggressor_type, common_movement)
BEGIN
    IF aggressor_type == ALPHA
        Update_EAT_DCC_Due_To_Strength_Change (victim, aggressor)
        /* can weaken or strengthen the aggressor */
        movement_amount = Movement_Due_to_Strength_Change_And_Movement (victim, aggressor)
    ELSE /* aggressor_type == BETA */
        movement_amount = Movement_Of_Source_node (aggressor)
    Update_LAT_Dynamic_Delay_Due_To_Movement (victim, movement_amount –
                                                      common_movement)
END
```

FIGURE 42

```
Update_Movement_Threshold (victim, type_of_analysis, movement_threshold)
/* type_of_analysis is either α_OR_β_AS_AGGRESSOR or α_OR_β_AS_VICTIM */
BEGIN
    FOREACH aggressor of victim  /* aggressor moving, non-tracking victims fixed */
        IF case_analysis_result (aggressor, victim, type_of_analysis) == (BY, CBY) /* If COK or NR, no bypassing possible */
            Get_Opposite_Side_Point_Of_DCC (aggressor)
            Insert_Point_In_Balanced_Tree (aggressor)    /* points are ordered by amount of bypass needed */
    ENDFOREACH
    bypass_amount = 0
    (bypass_amount, aggressor) = Get_Next_Largest_Bypass_Point (bypass_amount, α_OR_β_mode)
    Delete_From_Tree (aggressor)
    DO
        IF aggressor == α
            α_OR_β_mode = ALPHA
        ELSE
            α_OR_β_mode = BETA
        Update_Victim_EAT_Dynamic_Delay (victim, aggressor, α_OR_β_mode , 0)
        Update_Victim_LAT_Dynamic_Delay (victim, aggressor, α_OR_β_mode , 0)
        Add_To_Movement_Threshold (bypass_amount)
        IF Overall_Delta_EAT_Not_Positive (victim) || Overall_Delta_LAT_Not_Negative (victim)
            IF NOT Empty_Tree
                (bypass_amount, aggressor) = Get_Next_Largest_Bypass_Point (bypass_amount, α_OR_β_mode)
                Delete_From_Tree (aggressor)
            ELSE
                RETURN (LARGE_POSITIVE_NUMBER)
        ELSE
            movement_threshold = Binary_Search_For_Movement_Threshold (current_edge)
            RETURN (movement_threshold)

ENDDO
```

FIGURE 43

```
Trace (α, aggressor, call_count)
BEGIN
    FOREACH victim of aggressor
        IF Aggressor_Is_Fixed (aggressor) || Aggressor_Analyzed (aggressor)
            correction_for_α_movement = 0
        ELSE
            correction_for_α_movement = Get_Movement (α)
        EAT_dynamic_delay_change = Determine_EAT_Dynamic_Delay_Change (victim, aggressor, correction_for_α_movement)
        LAT_dynamic_delay_change = Determine_LAT_Dynamic_Delay_Change (victim, aggressor, correction_for_α_movement)
        IF (EAT_dynamic_delay_change < 0 || LAT_dynamic_delay_change > 0)
            IF Enough_Slack_On_This_Edge (victim)  /* Must be slack on an edge whose LAT increases
                                                      or EAT decreases to absorb movement so no need to consider
                                                      movement of downstream edges */
                IF call_count < TRACE_RADIUS
                    status = Trace (α, victim, call_count + 1)
                    IF status == FAIL
                        RETURN (FAIL)
            ELSE
                RETURN (FAIL)
    ENDFOREACH
    RETURN (SUCCEED)
END
```

FIGURE 44

```
Slack_Terminate_Path (current_edge, setup_or_hold)
BEGIN
    IF setup_or_hold == SETUP && Determine_Slack (current_edge) != 0
        RETURN (PATH_TERMINATED)  /* LAT longest path no longer active */
    IF setup_or_hold == HOLD && Determine_Slack (current_edge) > 0
        RETURN (PATH_TERMINATED)  /* EAT shortest path no longer active */
    RETURN (PATH_NOT_TERMINATED)
END
```

FIGURE 45

N = number of nets in aggressor weakening and victim paths v = max number of victims per aggressor considered a = max number of aggressors per victim considered s = number of buffering / sizing configurations possible at $\alpha$ t = tracing radius allowed (determining slowdown or speedup effect is assumed to take constant time)

(constant to represent combinations of aggressor weakening, victim strengthening, setup and hold is ignored)

Estimate per shortening: $O(st(a+b)N)$

FIGURE 46

⟶ (solid) = direction of movement due to
same direction movement
effects

-- ▶ (dashed) = direction of movement due to
intermediate effects

⌇▶ (serrated) = direction of movement due to
environmental effects

⌇⌇⋗ (checked) = direction of movement due to
intermediate effects in opposite
direction from movement effects

FIGURE 49

CROSSTALK MITIGATION METHOD AND SYSTEM

This is a divisional of application Ser. No. 09/977,372 filed Oct. 16, 2001 now U.S. Pat. No. 6,637,014, which claims benefit pursuant to 35 U.S.C. §120 of the filing date of Provisional Application No. 60/273,344 filed Mar. 6, 2001, pursuant to 35 U.S.C. §111(b); the above noted prior applications are both hereby incorporated by reference.

BACKGROUND OF THE INVENTION

1. Field of the Invention

The present invention relates to a system and method for mitigating crosstalk in integrated circuits, and more specifically, aggressor weakening and victim strengthening methods that reduce delay in setup violation cases and increases delay in hold violation cases.

2. Background of the Invention

Crosstalk in related art digital integrated circuits is becoming an increasingly important problem as geometries scale down.

The related art digital integrated circuits experience various problems and disadvantages due to crosstalk. For example, but not by way of limitation, in addition to causing functional failures due to glitching, crosstalk also causes delay changes resulting in both slowdown and speedup of circuit delays depending on the particular interaction of two simultaneously or near simultaneously switching signals.

As process geometries scale down in related art deep submicron processes, the problem of crosstalk is having a significant impact on gate level timing. The related art scaling process introduces closer metal pitches, taller and narrower lines, and accompanying increased operating frequencies, which increase the effects of coupling between lines. The ratio of coupling capacitance to total interconnect capacitance has grown to the point where the portion of interconnect capacitance attributable to coupling can now be as high as 80% for minimum pitch wiring.

Further, the increased coupling in the related art has the disadvantage of increasing crosstalk between wires. Crosstalk can have two substantially negative effects. First, crosstalk results in a functional effect called glitching that results in short pulses on quiet lines adjacent to switching lines. Glitches cause functional errors if they propagate logic level changes to latches.

Second, crosstalk results in a delay effect called dynamic delay (i.e., delay uncertainty), that results in either a slowdown or speedup in circuit delay when signals on adjacent lines switch at a substantially simultaneous time. At a 0.1 micron related art technology, the amount of dynamic delay can be +/−80% of nominal delay. When the effects of dynamic delay are considered in crosstalk aware static timing analysis (STA), setup and hold violations may occur if the aforementioned crosstalk are were not fully recognized in the design process.

Considering the aforementioned related art crosstalk problems, much related art research has been directed at mitigating the crosstalk problems. There has been related art work in crosstalk modeling, calculation of delay change due to crosstalk effects, and crosstalk aware STA. However, the related art work fails to address correcting the aforementioned related art dynamic delay problems of crosstalk.

It is well known in the related art that strengthening victims and weakening aggressors reduces dynamic delay. Commercial vendors refer to "noise balancing" where aggressors with a large "noise slack" (i.e., those aggressors that can absorb weakening without becoming a victim) are weakened, and victims with a small or no noise slack are strengthened.

However, the related art "blanket" approach previously described can worsen the dynamic delay problem, because there is no awareness of the critical path in the aforementioned related art technique. Further, delay change effects are significant even when aggressor and victim change relative switching time position with no strength change, which can happen for aggressors or victims on the critical path downstream from the site of strength change. The related art fails to reduce dynamic delay by using the results of crosstalk aware STA to guide dynamic delay reduction.

Coupling Effects

When signals on related art adjacent coupled lines switch at approximately the same time, there can be a significant effect on the delay of the signal whose driver is at a higher resistance at the time of switching. FIG. 1 illustrates how delays are calculated for an aggressor having an aggressor delay measurement point and a victim having a victim delay measurement point, as well as coupling effects. Victim and aggressor designations apply only to the current switching conditions and are not a permanent characteristic of certain wires. Thus, for different switching conditions, the victim and aggressor designations in FIG. 1 may be interchanged.

The difference in switching time between a victim and aggressor is referred to as skew. Input skew is the difference in switching times at the 50% switching points of victim and aggressor's input waveforms. The output skew is the difference in the switching times at the 50% switching points of aggressor and victim waveforms, measured at the input to the destination gate, as shown in FIG. 1. When aggressor and victim switch in opposite directions, the victim can be slowed down compared to the case of no proximate aggressor switching (i.e., a quiet aggressor line).

In FIG. 2, the victim is switching high and the aggressor low (i.e., dotted lines). The nominal (i.e., quiet aggressor) victim switching is shown as a dashed line. The solid line shows the case of a proximate switching aggressor, and the jag in the victim waveform shows the effect of slowdown. Since the aggressor is switching low, its lower (stronger) driver is turning on and going to low resistance. On the other hand, the victim's upper (weaker) driver is turning on. With a relatively strong aggressor and relatively weak victim, the point of maximum slowdown is when the aggressor switches slightly after the victim.

FIG. 3 illustrates the case of the aggressor and victim switching in the same direction. The proximate aggressor switching aids the switching of the victim by effectively removing the effect of some of the coupling capacitance that was slowing down the victim in the nominal case.

Various factors influence the amount of slowdown or speedup, including, but not limited to, the relative sizes of the aggressor and victim drivers, the output skew, the electrical characteristics of the nets involved, the amount of coupling between the nets, and the signal transition times of aggressor and victim (i.e., slew). In static timing analysis (STA), the switching directions of signals are not normally considered. Thus, for calculation of latest arrival time (LAT) in crosstalk aware STA, the signals switch in opposite directions to achieve the worst case switching time. Similarly, for calculation of the earliest arrival time (EAT), the signals switch in the same direction, to achieve the best case switching time.

DCC Curves

Related art approaches to STA where coupling between lines is represented by switch factors assume that when there is a possibility of coupling, the worst/best case (i.e., maximum delay for slowdown, or minimum delay for speedup) is used for calculating LAT or EAT. Those related art approaches have the disadvantage of over-constraining the design, and indicating longer clock periods than would be necessary if a more sophisticated analysis were performed. This related art approximation has been used in most recent approaches to crosstalk aware STA.

However, a newer related art approach based on a delay change curve (DCC) has been introduced for timing analysis, but not for crosstalk mitigation. As illustrated in FIG. 4, the related art DCC shows the amount of slowdown or speedup as a function of input skew. Input skew is considered negative if the aggressor switches before the victim, and input skew is zero if the aggressor and the victim switch simultaneously. The DCC curve is generated by fixing the victim and sweeping the aggressor from a large negative to large positive input skew. The range of input skews that cause a slowdown or speedup is referred to as the effective skew window. However, the related art use of the DCC is not for crosstalk mitigation, but only for timing analysis.

The related art DCC is a function of the above-listed parameters that affect slowdown and speedup, and is customized for the particular nets involved. Because there are too many parameters to allow full precharacterization of related art DCC curves, related art partial characterization or related art analytic generation are the only alternatives available in the related art. The generation of the related art curves is not within the scope of the present invention, and given an input skew, aggressor/victim strength, slew rate, the particular nets involved, and the coupling amount, the related art system returns the slowdown or speedup.

Further, the slope characteristics of the related art DCC curves are important. Based on empirical evidence, changes in input skew from large negative skew up to the skew producing the peak of the curve cause a relatively slow change in the rate of slowdown or speedup. As noted above, DCCs are not applied to crosstalk mitigation in the related art.

SUMMARY OF THE INVENTION

It is an object of the present invention to overcome at least the problems and disadvantages of the related art.

It is another object of the present invention to overcome the related art dynamic delay aspect of the related art crosstalk problem.

To achieve these and other objects, a method of mitigating crosstalk is provided, comprising (a) generating a timing graph based on static timing analysis and paths having input gates coupled by timing arcs, (b) determining a longest path in said timing graph capable of being shortened, and (c) comparing a length of a selected path to a clock period and setup time. The method also comprises (d) shortening said selected path by strengthening a victim or weakening an aggressor on said selected path if a setup time violation exists for said selected path and if said selected path is capable of being shortened, (e) recalculating said timing graph in accordance with (d), and (f) performing (c) through (e) until no setup time violation exists for said selected path, or said selected path is not capable of further shortening.

Additionally, another method of mitigating crosstalk is provided, comprising (a) generating a timing graph based on static timing analysis and paths having input gates coupled by timing arcs, (b) determining a shortest path in said timing graph capable of lengthening, (c) comparing a clock period and a hold requirement time to a length of a selected path, and (d) shortening said selected path by strengthening said victim or weakening said aggressor on said selected path if a hold requirement time violation exists for said selected path and said selected path is capable of being lengthened. The method further comprises (e) recalculating said timing graph in accordance with (d), wherein (c) through (e) are performed until, and (f) performing (c) through (e) until no holdup requirement time violation exists for said selected path, or said selected path is not capable of further lengthening.

Further, yet another method of mitigating crosstalk is provided, comprising (a) generating a timing graph based on static timing analysis and paths having input gates coupled by timing arcs, (b) determining a longest path in said timing graph capable of being shortened, (c) comparing a length of a selected path to a clock period and a setup time, and (d) shortening said selected path by strengthening a victim or weakening an aggressor on said selected path if a setup time violation exists for said selected path and if said selected path is capable of being shortened. The method also comprises (e) recalculating said timing graph in accordance with (d), (f) performing (c) through (e) until no setup time violation exists for said selected path, or said selected path is not capable of further shortening, (g) determining a shortest path in said timing graph capable of lengthening, and (h) comparing said clock period and a hold requirement time to said length of said selected path. Also, the method comprises (i) shortening said selected path by strengthening said victim or weakening said aggressor on said selected path if a hold requirement time violation exists for said selected path and said selected path is capable of being lengthened, and (j) recalculating said timing graph in accordance with (i), wherein (g) through (j) are performed until no holdup requirement time violation exists for said selected path, or said selected path is not capable of further lengthening.

Further a network having a plurality of input gates coupled by timing arcs is provided, comprising a critical path comprising a first plurality of timing arcs, and a non-critical path comprising a second plurality of timing arcs, wherein crosstalk is mitigated in said network by strengthening a victim thereby making said critical path faster, or weakening an aggressor by delaying said non-critical path.

Additionally, an integrated circuit is provided, comprising a first line having a first signal, and a second line having a second signal, wherein there is substantially simultaneous switching of the said first and said second signal causing crosstalk, and wherein the resulting crosstalk is mitigated by shortening a longest path or lengthening a shortest path.

BRIEF DESCRIPTION OF THE DRAWINGS

The accompanying drawings, which are included to provide a further understanding of preferred embodiments of the present invention and are incorporated in and constitute a part of this specification, illustrate embodiments of the invention and together with the description serve to explain the principles of the drawings.

FIG. 22 illustrates a chart of a case of backward movement slowdown according to the preferred embodiment of the present invention;

Figure 23:
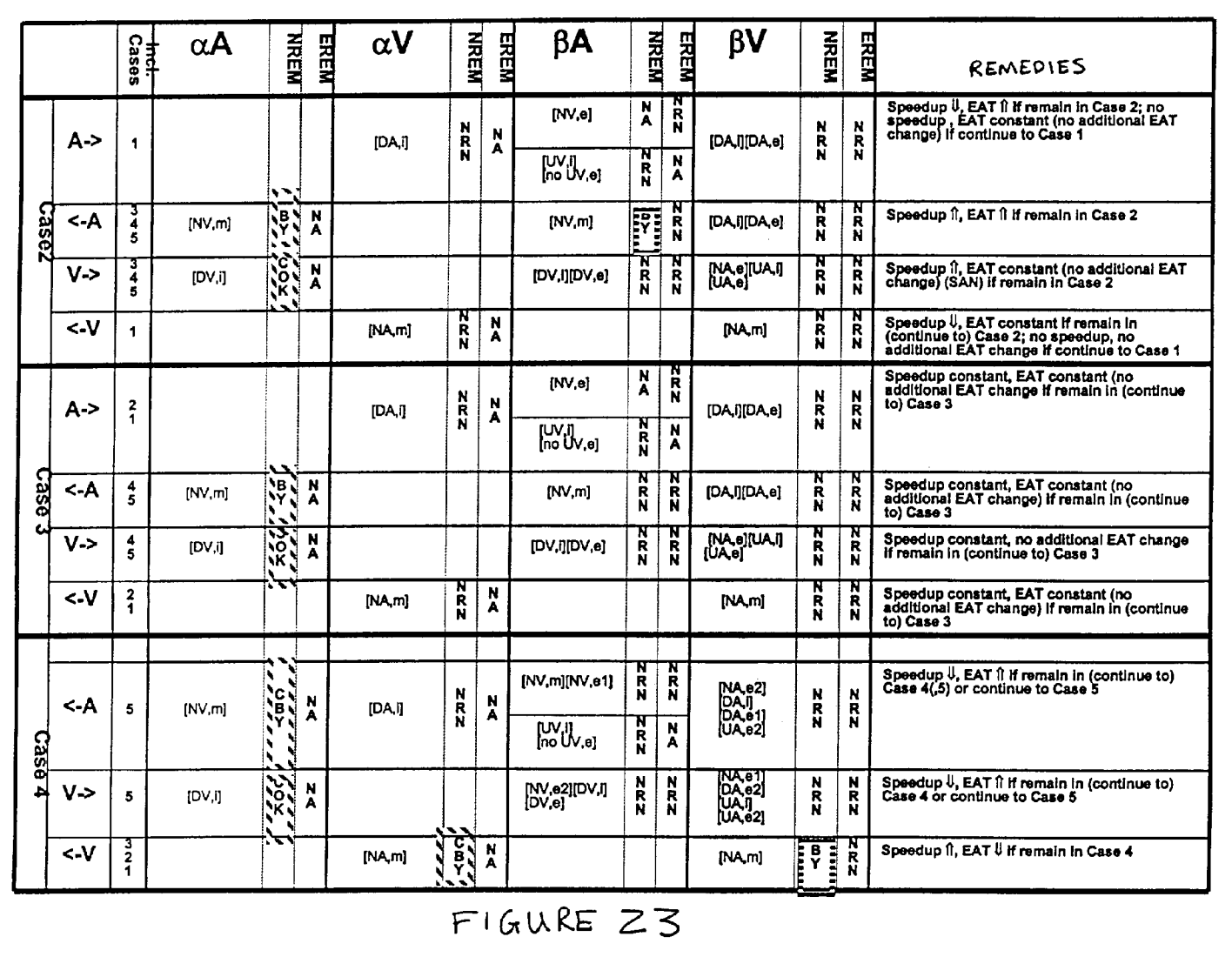

FIG. 23 illustrates a chart of a case of backward movement speedup according to the preferred embodiment of the present invention;

Figure 24:
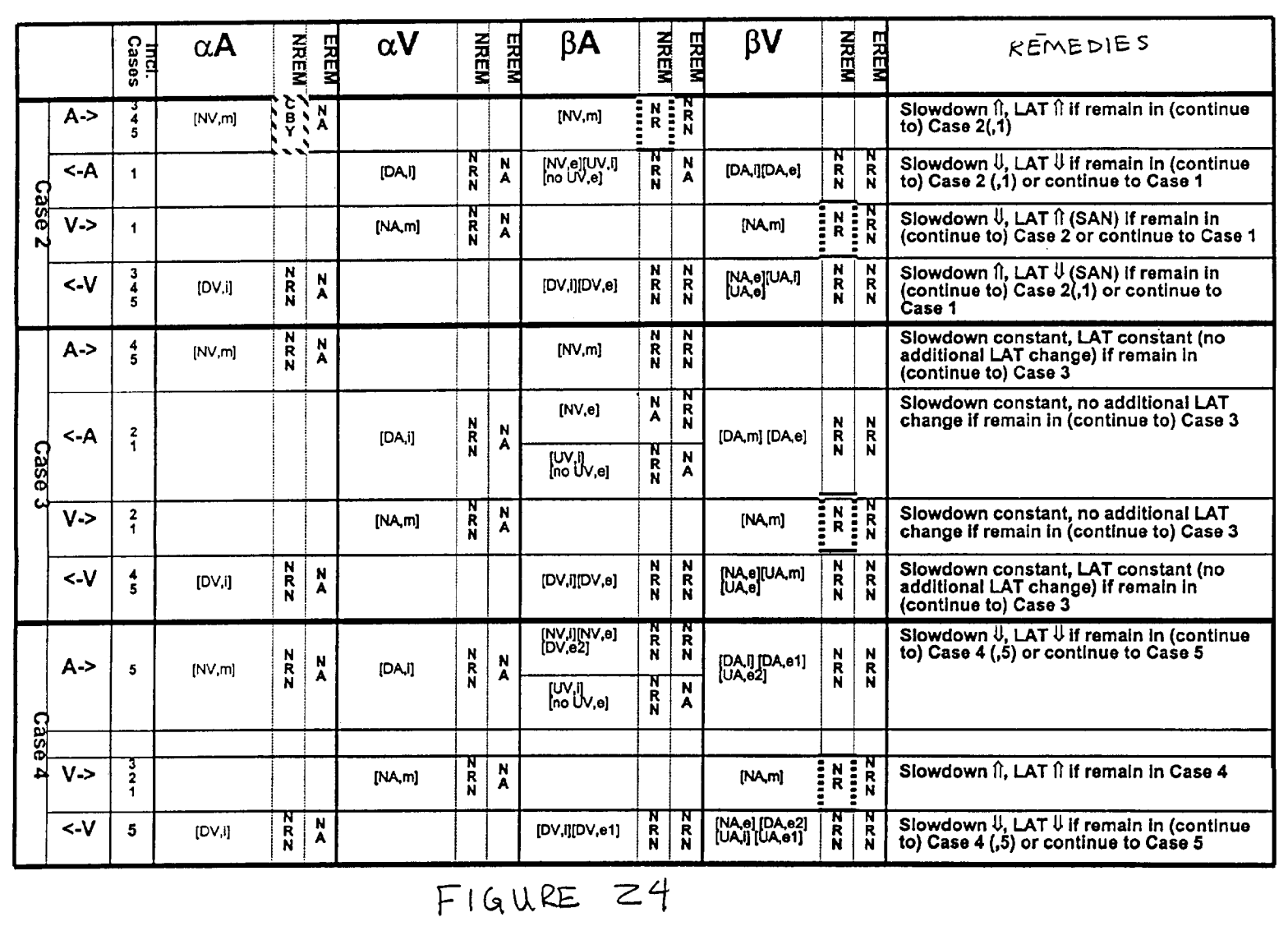

FIG. 24 illustrates a chart of a case of forward movement slowdown according to the preferred embodiment of the present invention;

FIG. 25 illustrates a chart of a case of forward movement speedup according to the preferred embodiment of the present invention;

FIG. 26 illustrates a summary of abbreviations illustrated in FIGS. 22–25;

FIG. 35 illustrates a top level procedure for implementing the method according to the preferred embodiment of the present invention;

FIGS. 36–45 illustrate additional procedures for implementing the method according to the preferred embodiment of the present invention;

FIG. 46 illustrates the complexity of the preferred embodiment of the present invention;

FIGS. 48 and 49 illustrate the definitions for symbols illustrated in various ones of the aforementioned figures according to the preferred embodiment of the present invention.

DETAILED DESCRIPTION OF THE INVENTION

Reference will now be made in detail to the preferred embodiment of the present invention, examples of which are illustrated in the accompanying drawings. In the present invention, the terms are meant to have the definition provided in the specification, and are otherwise not limited by the specification.

In the present invention, the effects of crosstalk on delay are mitigated by using targeted transistor sizing and buffer insertion to either weaken crosstalk aggressors or strengthen crosstalk victims.

In the related art, DCC curves have only been used for timing analysis, but not for crosstalk mitigation or modifying those curves for crosstalk mitigation. Thus, it is a novel feature of the present application to apply DCC curves to crosstalk mitigation.

For the DCC curve, it is assumed that the DCC curve can be modified, which limits the potential paths of analysis, increases the possibility of aggressor or victim strength changes being acceptable, reduces the number of interactions of aggressor and victim that require analysis, and allows the picking of a precise position of a victim or aggressor giving worst case slowdown or speedup within their respective timing windows. Without the DCC curve modifications, the guarantee of helpfulness of the changes does not go beyond a small cone of influence.

Figure 1:
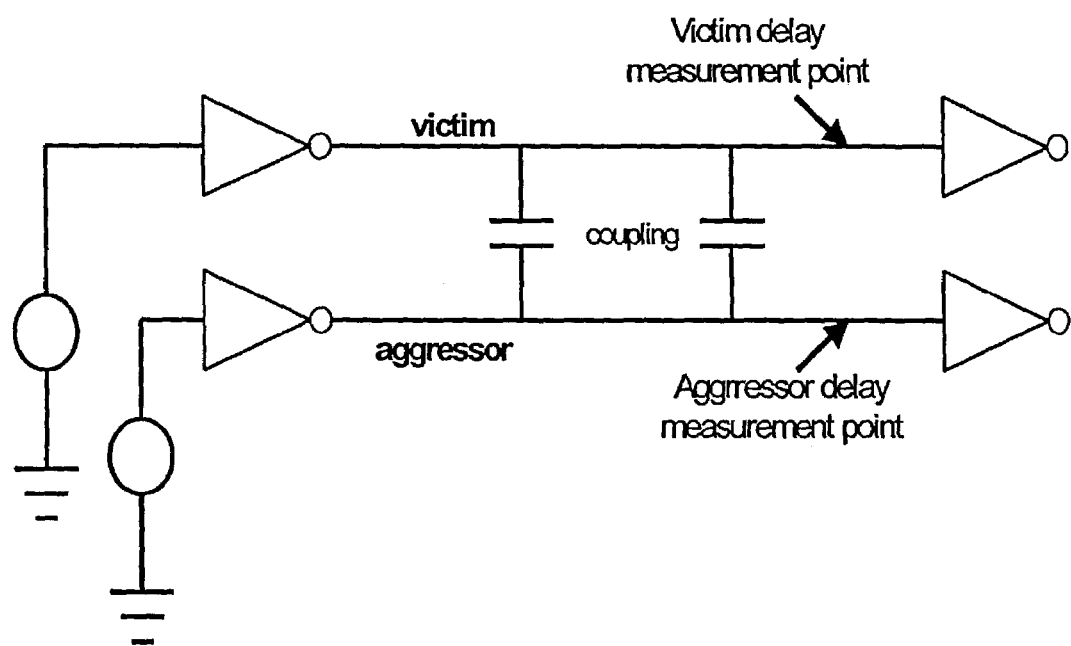
FIG. 1 illustrates related art aggressor and victim designations.
Figure 2:
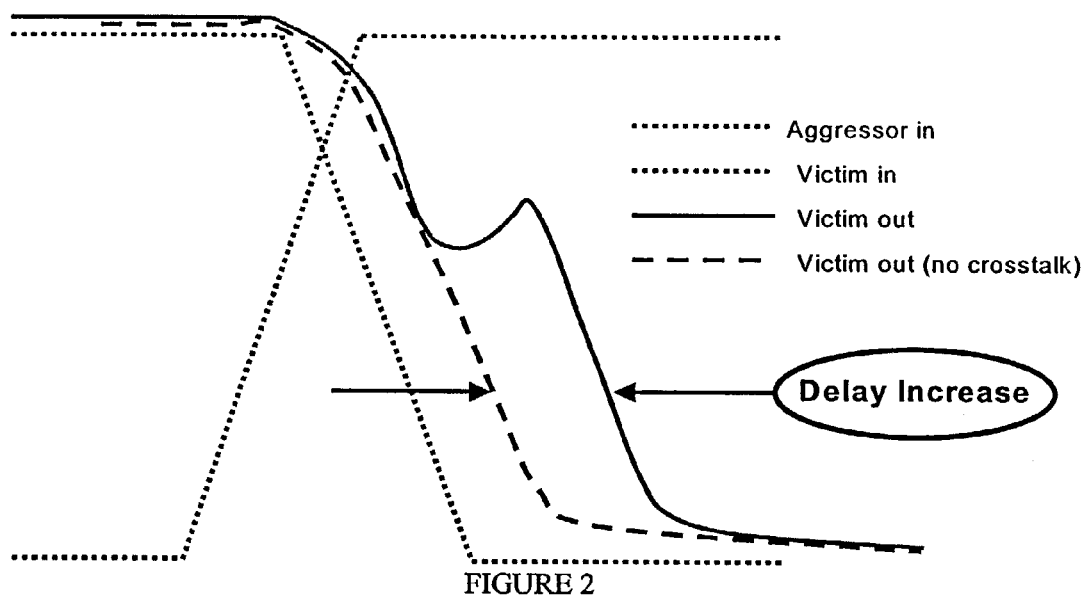
FIG. 2 illustrates a graphical representation of slowdown due to the related art crosstalk problem.
Figure 3:
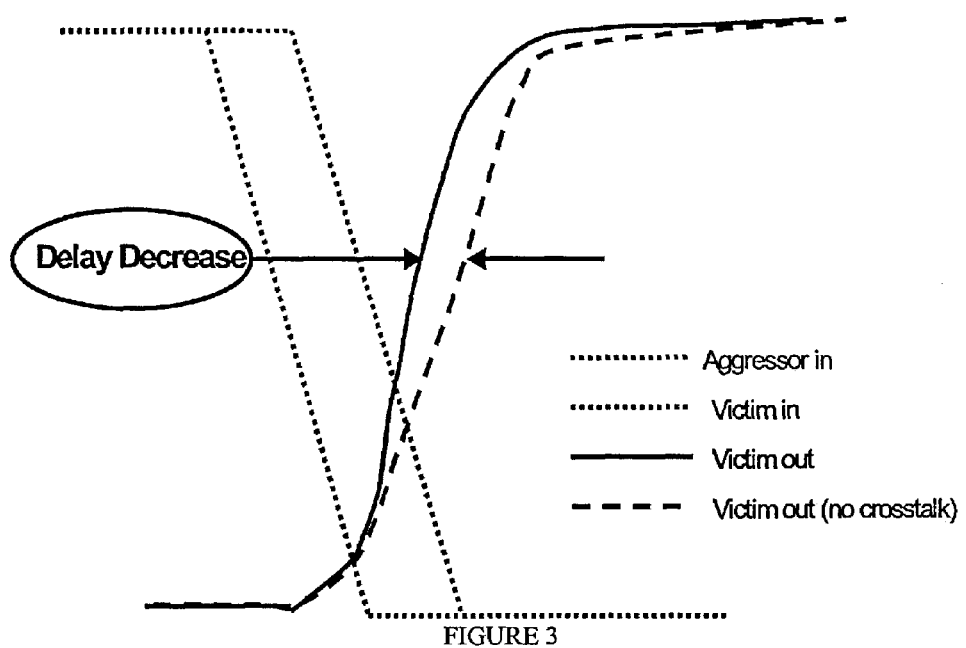
FIG. 3 illustrates a graphical representation of speedup due to the related art crosstalk problem.
Figure 4:
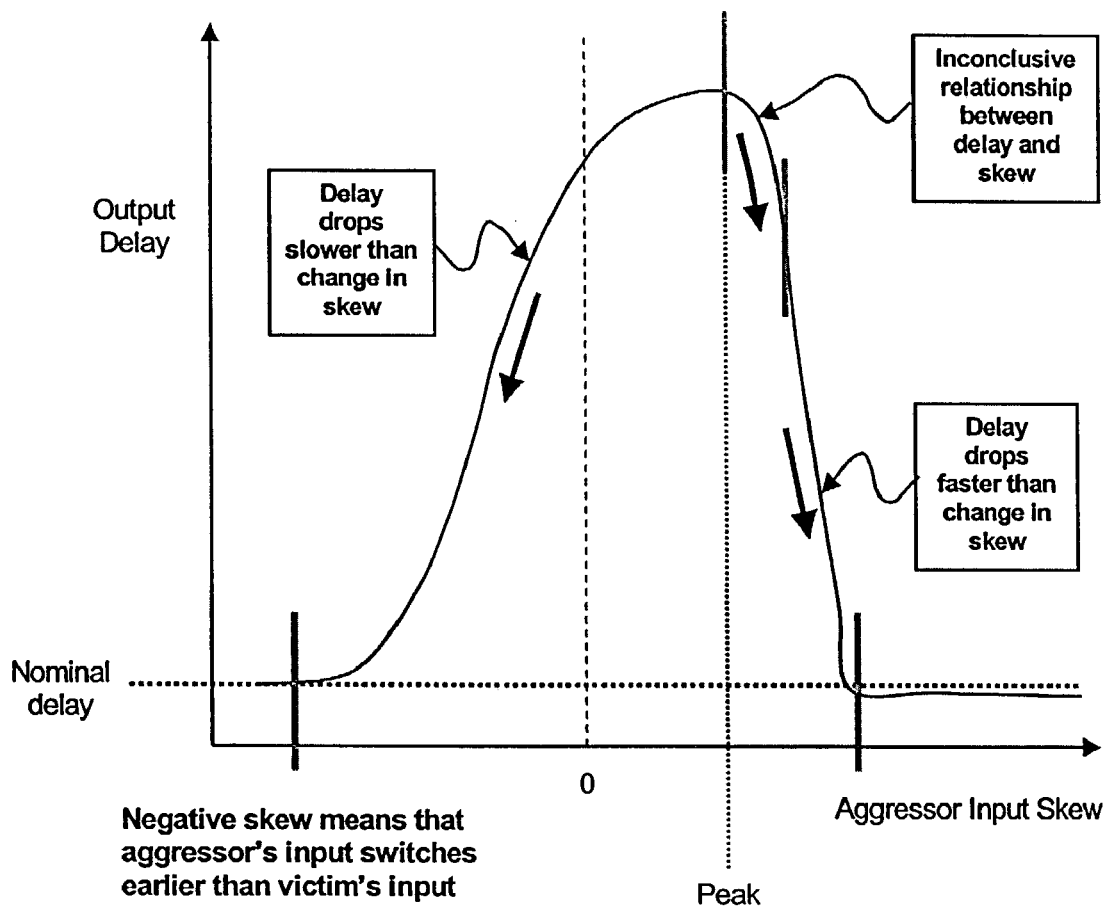
FIG. 4 illustrates a delay change curve (DCC) illustrating slowdown.
Figure 5:
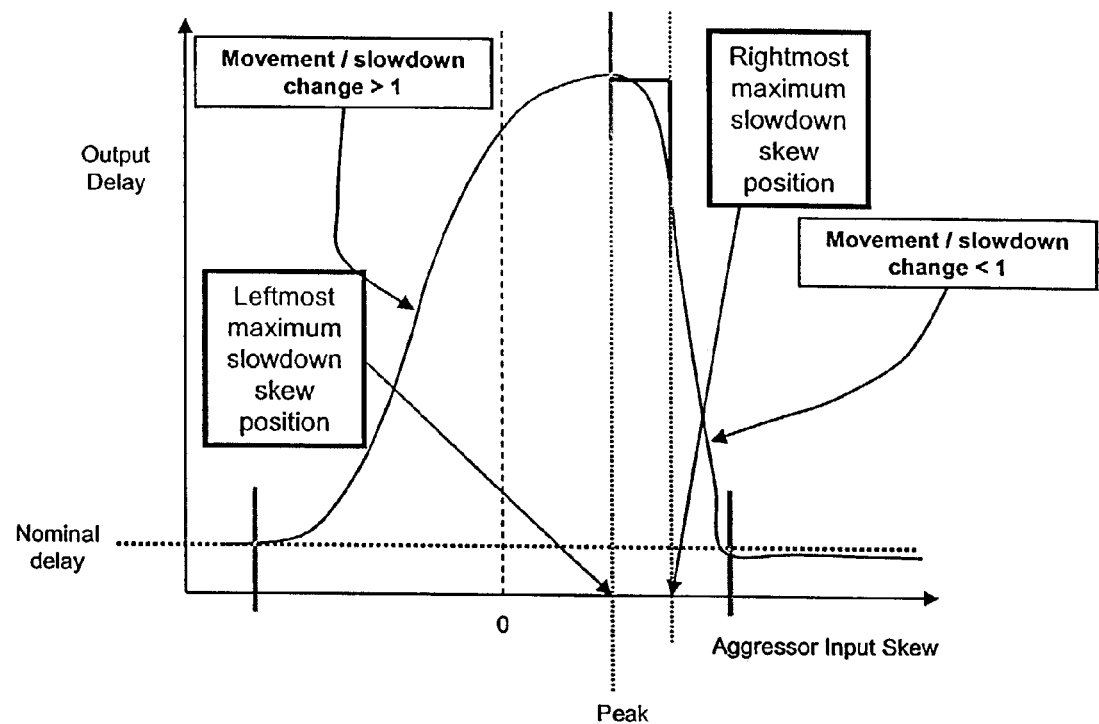
FIG. 5 illustrates a modified DCC curve for step-down according to a preferred embodiment of the present invention.

Changes in the skew from the skew that produces the peak of the curve to a large positive skew can cause either a fast or slow change in slowdown or speedup. For a fast change, there is a region near the peak of the curve where the slope of the curve is not predictable. In that case, to aid the analysis and crosstalk mitigation algorithm to follow, the peak of the curve is extended right and a "step down" is inserted above the real curve, as shown in FIG. 5.

Figure 6:
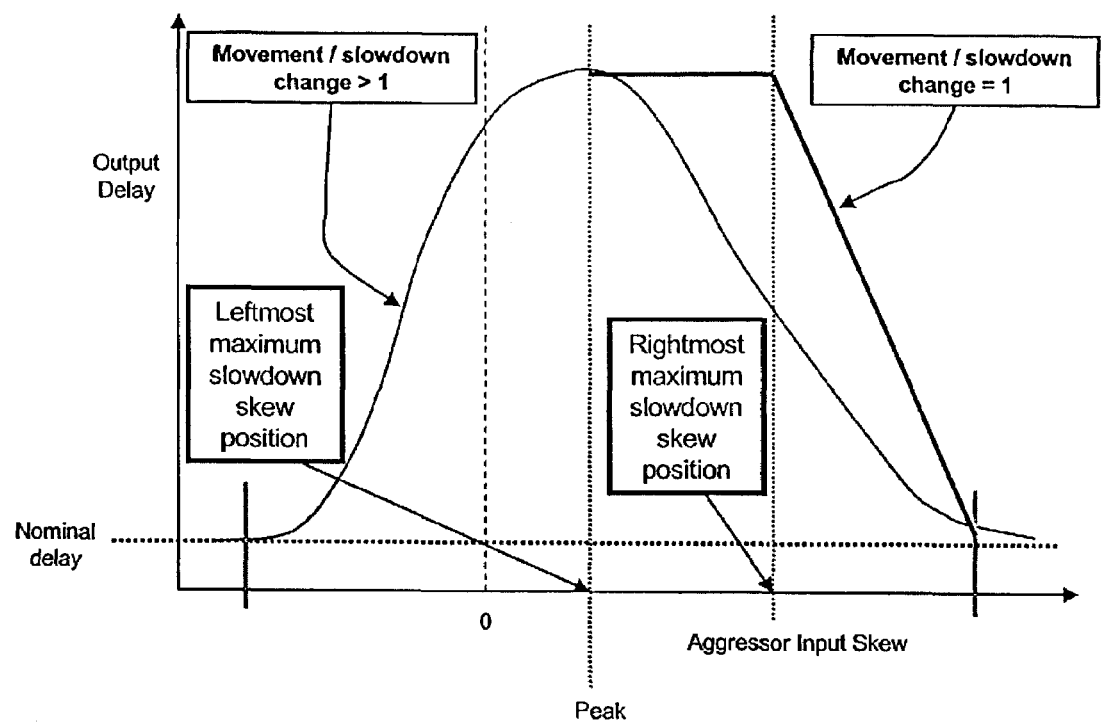
FIG. 6 illustrates a modified DCC curve for ramping according to a preferred embodiment of the present invention.

In the case of a slow change, instead of a step down, a slope-of-one ramp is entered, as illustrated in FIG. 6. The modifications to the related art DCCs guarantee that as input skew changes from the peak of the slowdown/speedup curve to large positive input skew, the slowdown/speedup changes at least at the rate of change of input skew. The explanation that follows assumes that the modifications to the DCC according to the preferred embodiment of the present invention have been completed, which is discussed in greater detail below.

LAT and EAT Modification

Aggressor and victim interactions can be categorized based on one (e.g., victim) being stationary and the other (e.g., aggressor) moving in some direction relative to the first one. The interactions are also categorized by what part of the DCC is active during the aggressor-victim interaction. Since windows in STA represent the switching times of aggressor and victim, a precise position within a window for both aggressor and victim can be found which represents the greatest slowdown or speedup.

Figure 7:
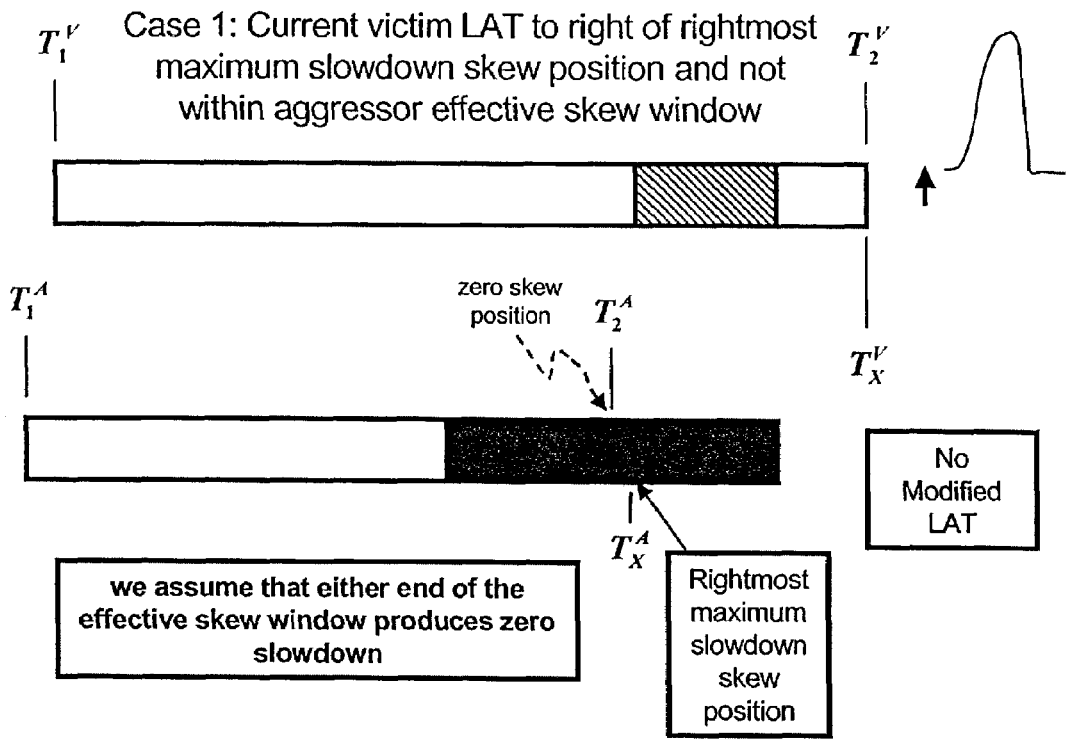
FIGS. 7–11 illustrate latest arrival time (LAT) modifications according to the preferred embodiment of the present invention.

For LAT modification, victims move from right to left relative to an aggressor. FIG. 7 shows the case when the current LAT of the victim is outside of the effective skew window of the aggressor (i.e., current victim LAT to right of rightmost maximum slowdown skew position and not within aggressor effective skew window). In all the figures the EATs are indicated by T1 and the LATs are indicated by T2. The precise chosen position for the victim (or aggressor) is TXV (or TXA). In FIG. 7, it is assumed that either end of the effective skew window produces zero slowdown.

The precise positions for victim and aggressor can be selected anywhere within their windows to get maximum slowdown or speedup, and the precise positions chosen result in the smallest relative separation, which always results in the maximum slowdown or speedup because of the tail off of the DCC on each side of the peak slowdown and speedup. However, the choice of exact positions of aggressor or victim to achieve maximum LAT or minimum of EAT does not always correspond to the position giving maximum slowdown or speedup.

In Case 1 as shown in FIG. 7, maximum slowdown occurs if TXV is the same as the chosen position for the aggressor TXA. However, the modified LAT position falls within the current window. Thus, the maximum LAT is the same as the current LAT, and TXV is chosen at that position.

Figure 8:
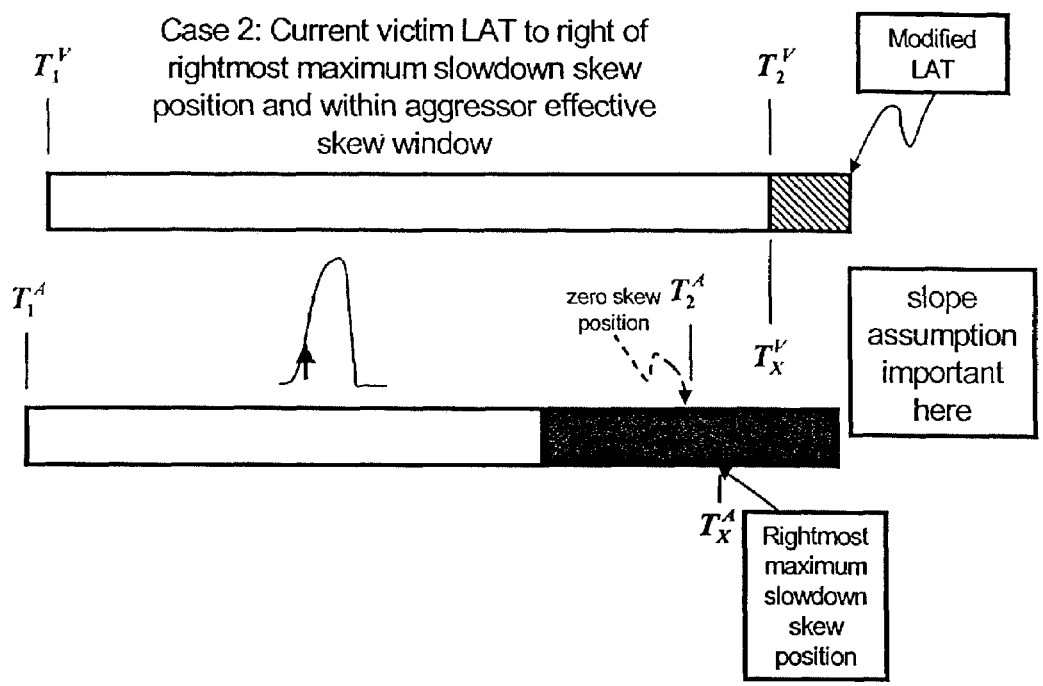

In Case 2 as shown in FIG. 8 (i.e., current victim LAT to right of rightmost maximum slowdown skew position and within aggressor effective skew window), as T2V moves farther to the left it will come under the influence of the aggressor effective skew window (AESW) and the slowdown will increase LAT. Left movement of T2V will overcome the increase in slowdown, causing a net decrease in LAT because of the slope assumption in this region of the DCC being important.

Figure 9:
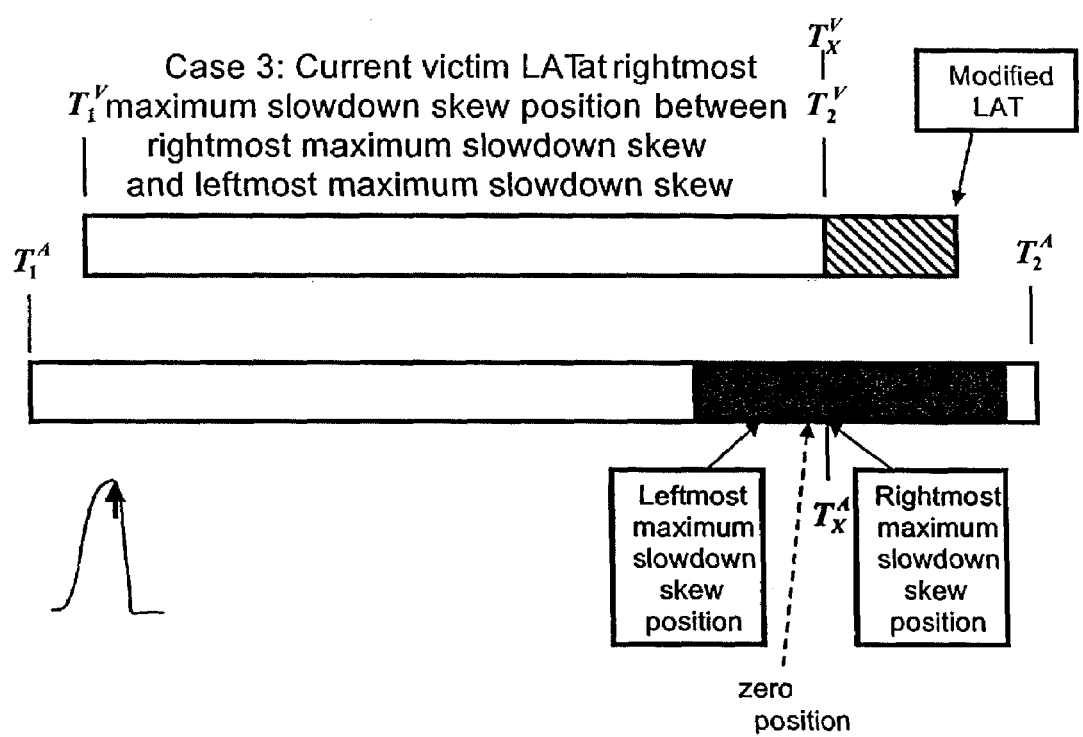
Figure 10:
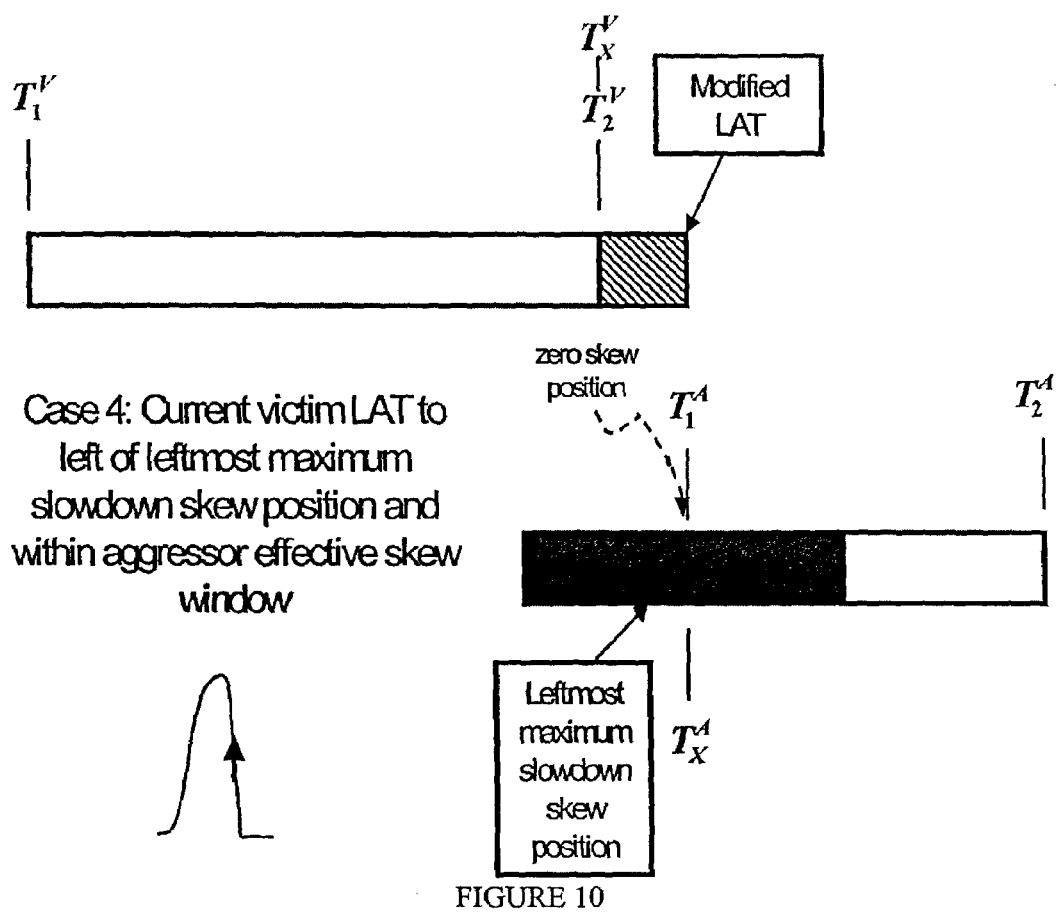
Figure 11:
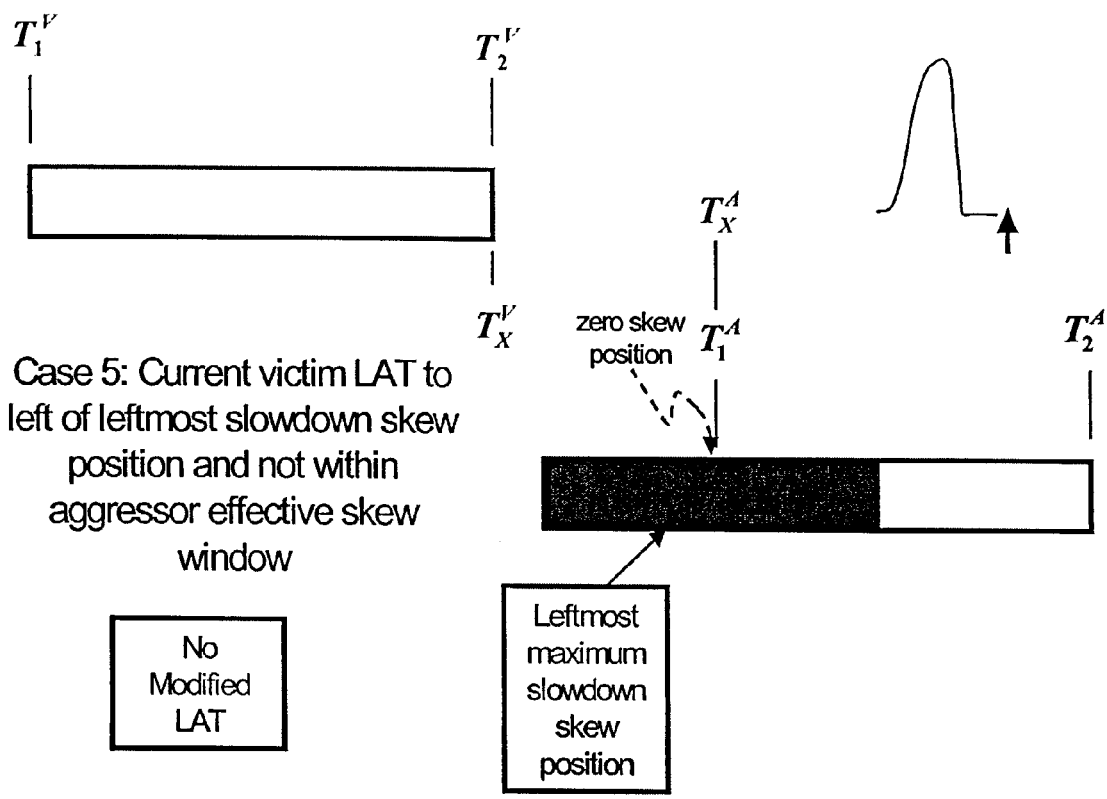

Eventually, with further left movement, Case 3 is entered as shown in FIG. 9 (i.e., current victim LAT at rightmost maximum slowdown skew position between rightmost maximum slowdown skew and leftmost maximum slowdown skew). The TXV position is now at the rightmost maximum slowdown skew position, rather than the zero skew position, because the aggressor position can be chosen anywhere within the aggressor window. As the victim continues to move left, the slowdown stays constant, so LAT tracks victim movement and AESW moves with T2V until the zero skew position hits T1A. Then, the aggressor window can no longer track. Slowdown continues at a maximum until further left movement of T2V brings the zero skew position to the left of the leftmost maximum slowdown skew position, as illustrated in FIG. 10 (i.e., Case 4: current victim LAT to left of leftmost maximum slowdown skew position and within aggressor effective skew window). At that point, slowdown will start to decrease at least as fast as LAT left movement. Thus, LAT will decrease with further left movement of T2V. Finally, T2V will clear the left end of the AESW, and Case 5, as shown in FIG. 11 (i.e., current victim LAT to left of leftmost maximum slowdown skew position and not within aggressor effective skew window), is entered. Hence, LAT will decrease overall with right to left victim movement and a fixed aggressor.

Figure 12:
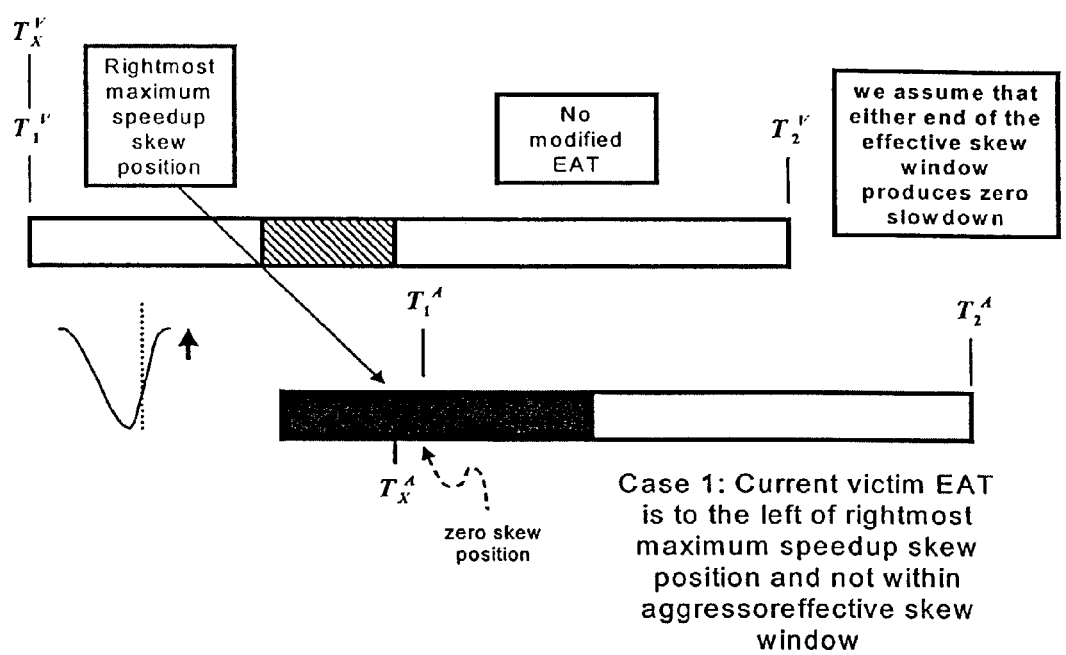
FIGS. 12–16 illustrate earliest arrival time (EAT) modifications according to the preferred embodiment of the present invention.

For EAT modification, it is assumed that victims move from left to right. In FIG. 12 (i.e., Case 1: current victim EAT is to the left of rightmost maximum speedup skew position and not within aggressor effective skew window) the current victim EAT is outside the AESW. The speedup is contained within the victim window and hence, EAT does not change. As the victim T1V moves farther right with TXV positioned at the rightmost maximum speedup position of the AESW, the current EAT of the victim touches the leftmost end of the AESW. Rightmost and leftmost retain their meanings with respect to the DCC. Further right movement of the victim T1V will not produce an increase in EAT, since speedup is increasing at least at the rate of movement of EAT and hence, the speedup at the rightmost maximum speedup position can always be considered to dominate.

Figure 13:
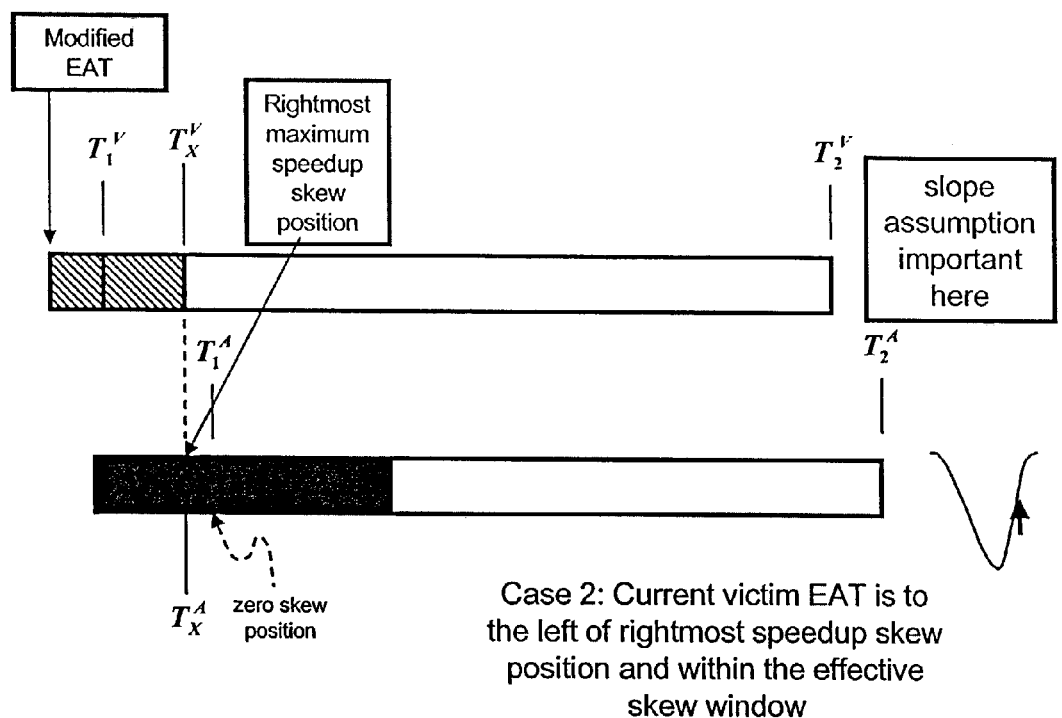
Figure 14:
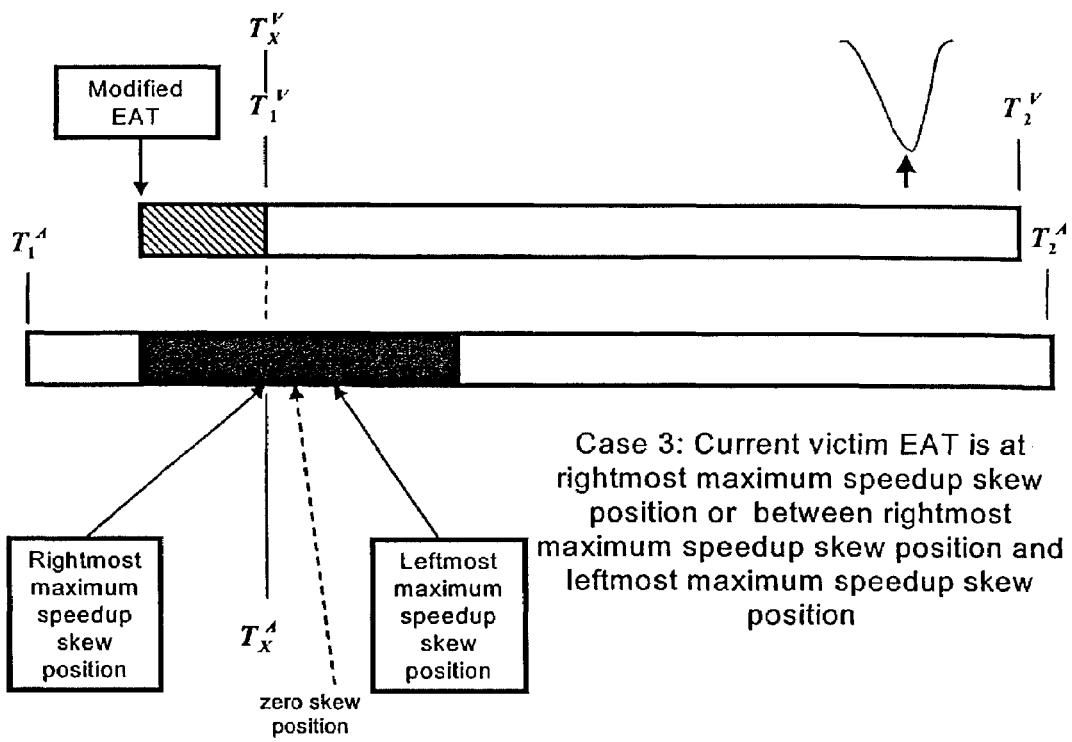
Figure 15:
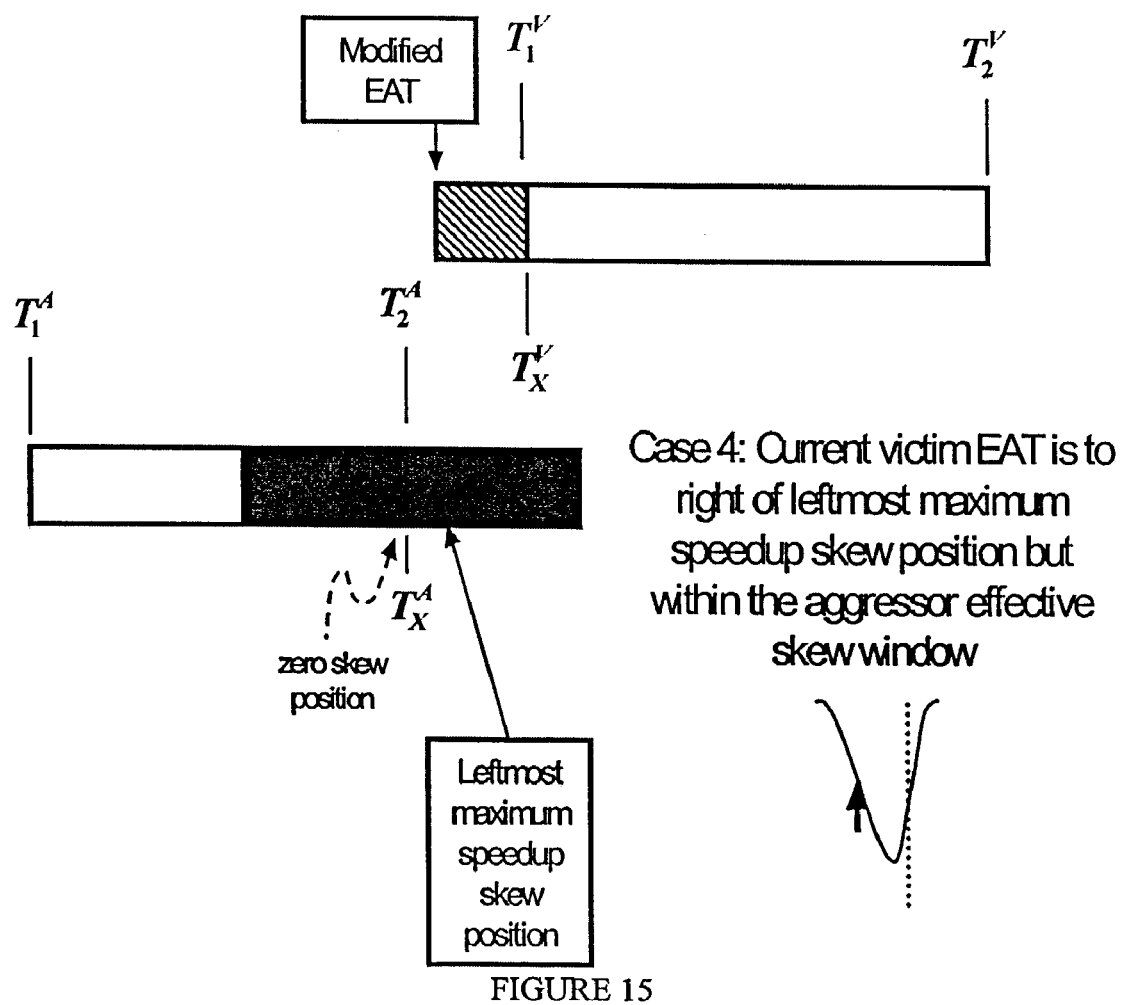
Figure 16:
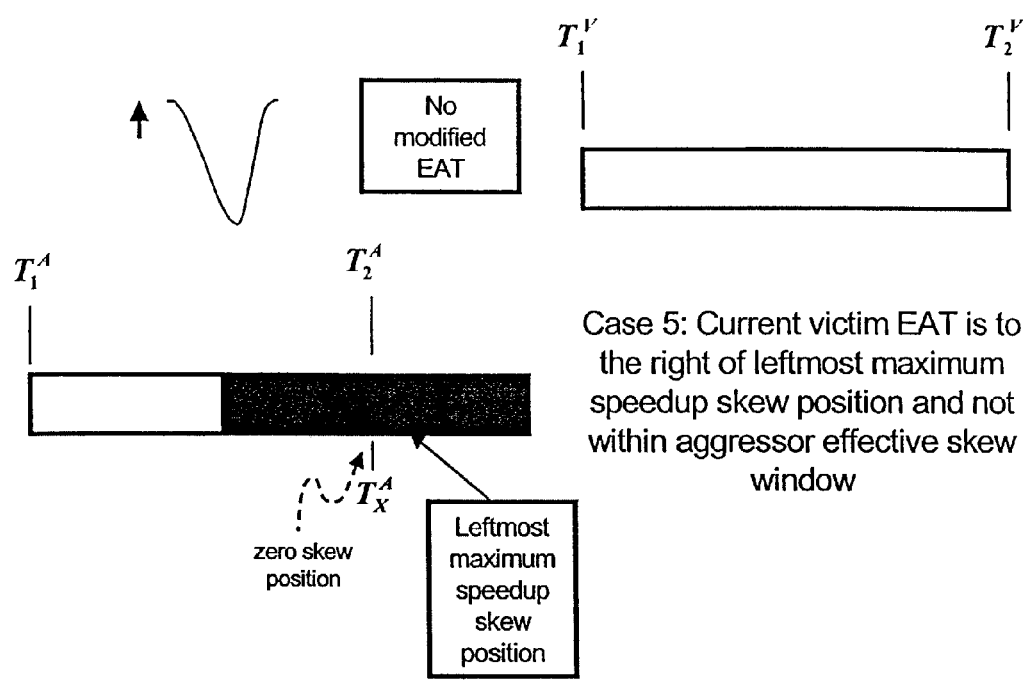

Thus, the new EAT is constant in Case 2, as shown in FIG. 13 (i.e., current victim EAT is to the left of rightmost maximum speedup skew position and within effective skew window). When T1V reaches the rightmost maximum speedup position, the new EAT begins to increase again, which continues until the current EAT clears the leftmost maximum speedup position as shown in FIG. 14 (i.e., Case 3: current victim EAT is at rightmost maximum speedup skew position or between rightmost maximum speedup skew position and leftmost maximum speedup skew position), when speedup starts to decrease. In this region of the DCC, speedup decreases more slowly than T1V moves right, so EAT continues to increase as shown in FIG. 15 (i.e., Case 4: current victim EAT is to the right of leftmost maximum speedup skew position but within the aggressor effective skew window) until finally, T1V clears the end of the AESW as shown in FIG. 16 (i.e., Case 5: current victim EAT is to the right of leftmost maximum speedup skew position and not within aggressor effective skew window). Hence, EAT increases overall or does not change with left to right victim movement having a fixed aggressor.

Accordingly, a precise position within victim and aggressor windows can be determined that gives the largest change of LAT or EAT. The position of the peak of the DCC, and the slopes of the modified DCC curves allow assumptions to be made about the how LAT or EAT will change, which can be extended to include any relative movement of aggressor and victim.

Timing Graph

Figure 17:
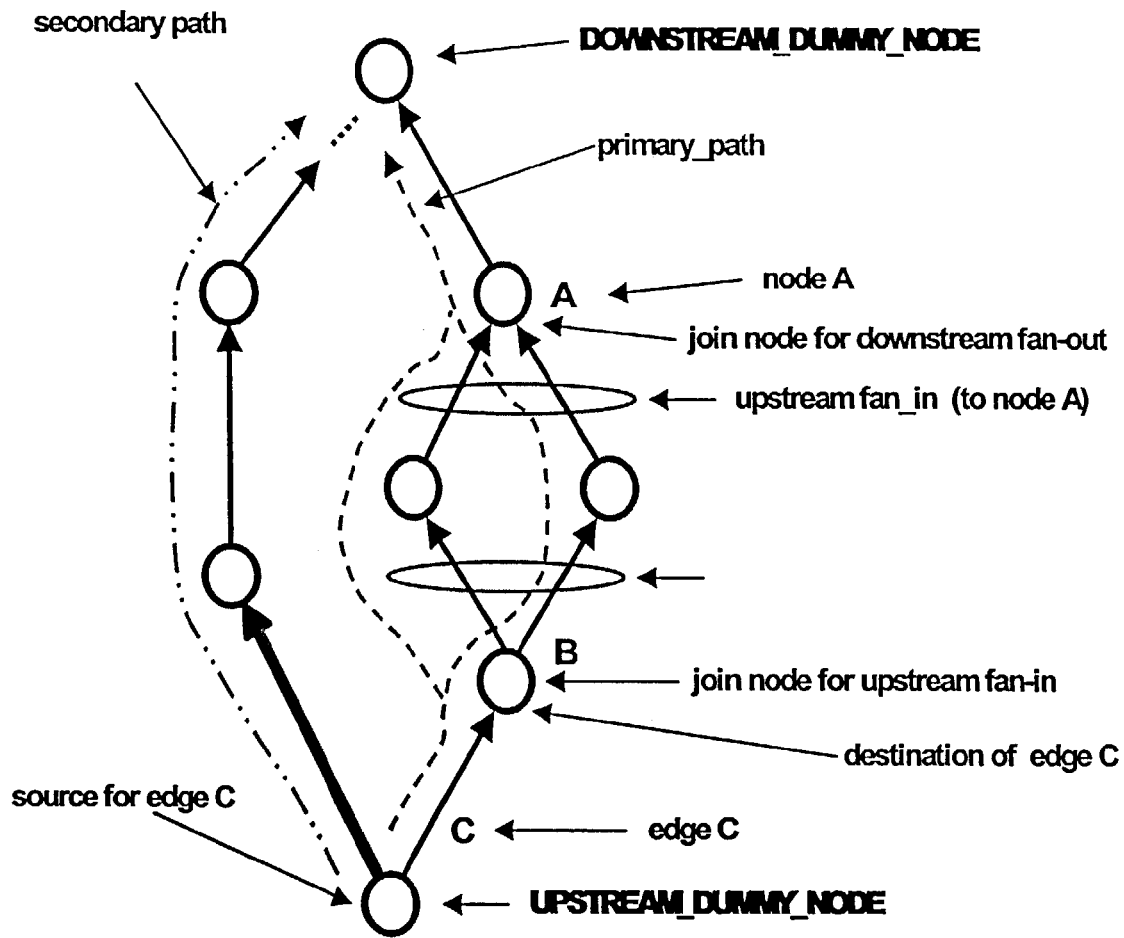
FIG. 17 illustrates a timing graph according to the preferred embodiment of the present invention.

FIG. 17 shows several definitions associated with a timing graph. Timing graphs are easily constructed using the results of static timing analysis (STA). The nodes represent the inputs to gates, and the edges represent connections (e.g., timing arcs) through gates and nets to other gates. Associated with an edge are the LAT and EAT values for nets. Two dummy nodes are inserted: the Downstream_Dummy_Node is the destination node for all edges that connect to output latches, and the Upstream_Dummy_Node is the source node for all edges that connect to input latches. Paths may have forks and joins. Downstream fan-out are edges emanating from a node at a fork, and upstream fan-in are edges entering a node at a join.

Algorithmic Strategies

The two basic strategies for crosstalk mitigation are victim strengthening and aggressor weakening. Dynamic delay susceptibility of particular nets in a design is a strong function of the strength (size) of drivers for those lines. Increasing the strength of a victim reduces the victim susceptibility to delay increases or decreases due to coupling. Victim strength increase is a direct approach to reducing the impact of coupling, whereas reducing strength of an aggressor impacting a victim is an indirect approach to reducing the impact of coupling, because the crosstalk susceptibility of an aggressor viewed as a victim actually increases. The present invention employs both strategies.

Strength changes can be accomplished by transistor sizing at the output of driving gates and/or buffer insertion. Modem ASIC libraries do not contain a large range of sizes for gates (i.e., usually only two or three sizes). In contrast, many different buffer (or inverter) sizes are available. Thus, strength changes are made using a combination of gate sizing and buffer insertion. For example, strength increases are made by adding buffers and/or changing the sizes of buffers, as well as adjusting gate sizes. Many calls to buffering or gate sizing adjustment may be necessary before a final decision is made regarding actual strength change. Thus, efficiency of buffer insertion is critical for the overall efficiency of crosstalk mitigation. In the present invention, related art buffer insertion techniques are applied.

DCC curves and standard STA can be used to produce crosstalk aware STA. Further, a crosstalk aware STA tool available is able to identify the LAT longest paths and EAT shortest paths. The LAT of each edge can be calculated by Equation (1):

$$LAT_j = \max_{i=1,\ldots n}\left(LAT_{input_i} + WCD_{input_i \to fanout_j}\right) \quad (1)$$

WCD means worst case delay. The LAT longest paths can be constructed by taking the largest LATs at output latches and finding zero slack edges on paths back to the input latches. Other edges with the same destination nodes will have positive slacks.

Similarly, the EAT of each edge can be calculated by Equation (2):

$$EAT_j = \min_{i=1,\ldots n}\left(EAT_{input_i} + BCD_{input_i \to fanout_j}\right) \quad (2)$$

BCD means best case delay. The EAT shortest paths can be constructed by taking the smallest EAT at the output latches and finding minimum zero slack edges on paths back to the input latches. Other edges with the same destination nodes will have negative slacks.

Figure 18:
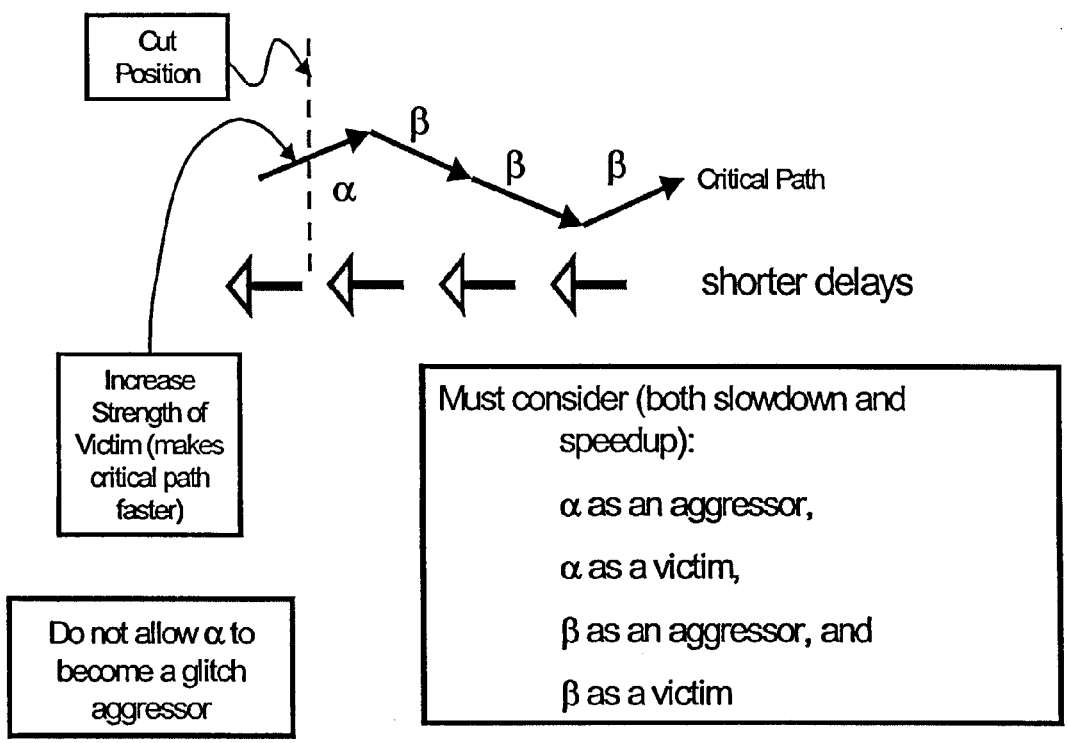
FIG. 18 illustrates a victim strengthening strategy according to the preferred embodiment of the present invention.

FIG. 18 illustrates the victim strengthening strategy according to the present invention. Only LAT longest paths (critical paths) are described herein. The edge where the victim will be strengthened is designated as $\alpha$. Changing the strength of $\alpha$ decreases the delay of $\alpha$, and other edges on the critical path, designated by $\beta$, will move back. The edges that move as a result of the strength change of a include not only critical path edges, but also the edges on the off-critical paths that may be attached to moving edges on the critical path.

Paths created by moving edges associated with $\alpha$ as a victim are called victim paths. Critical paths edges are part of primary victim paths, and non-critical path edges are part of secondary victim paths. The movement of a may be large enough that $\beta$ edges will move back enough to form a new critical path, because off critical paths whose edges had positive slack at a destination node of a $\beta$ edge become zero slack edges, and the original $\beta$ edge now has positive slack. When new critical paths are formed, critical path shortening stops at an amount of shortening less than the movement of $\alpha$ would normally produce.

Before crosstalk mitigation begins, all instances of glitching that cause functional errors are removed by a related art technique. Victim strengthening is not allowed if the strength increase necessary to shorten the critical path will cause the victim to become a glitch aggressor (i.e. cause functional errors because of glitching).

Because of the possibility of a victim becoming an aggressor and vice versa, analyses of $\alpha$ as a victim and $\alpha$ as an aggressor and each $\beta$ as both an aggressor and victim are necessary. Not shown in the FIG. 18 are secondary paths whose edges move as a result of a movement. A $\beta$ analysis must also be done on those paths.

Figure 19:
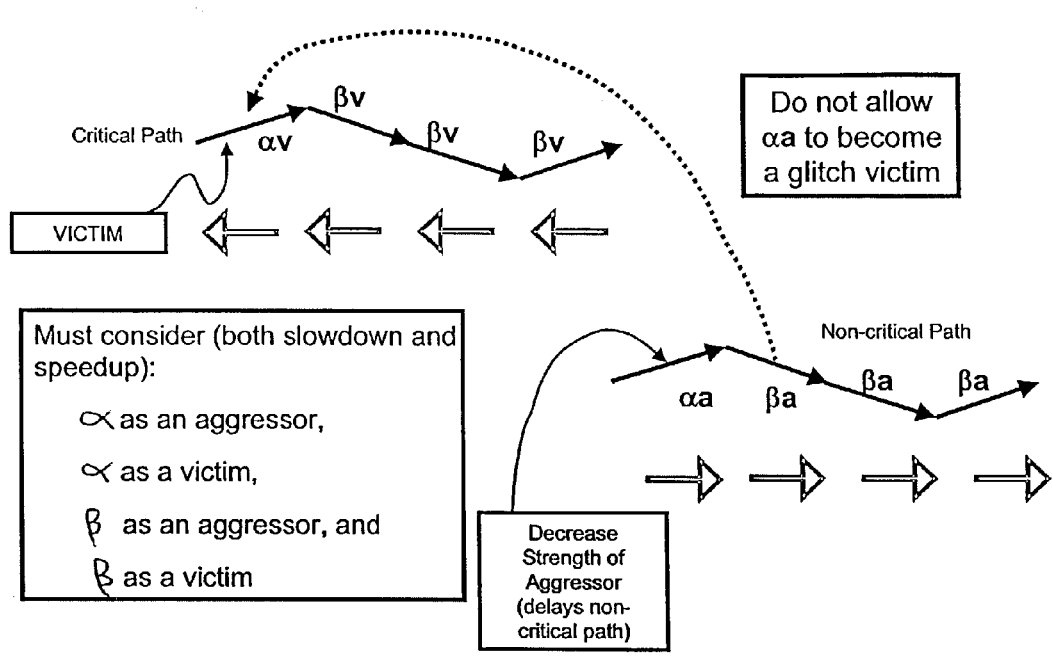
FIG. 19 illustrates an aggressor weakening strategy according to the preferred embodiment of the present invention.

FIG. 19 shows the aggressor weakening strategy, which delays a non-critical path. Similar to victim strengthening, aggressor weakening is not allowed if the strength decrease will cause the aggressor to become a glitch victim. As in victim strengthening, all cases of $\alpha$ and $\beta$ as aggressor and victim must be analyzed. The $\alpha$ and $\beta$ on the off-critical path where aggressor strengthening is performed may move forward rather than backward. As in victim strengthening, all $\beta$s on primary and secondary moving paths must also be analyzed. Paths that are created by moving edges associated with a as an aggressor in the aggressor weakening strategy are referred to as aggressor weakening paths. The primary and secondary paths of moving edges in the aggressor weakening strategy are called primary and secondary aggressor weakening paths.

Aggressor-Victim Interactions

To implement the above-described algorithmic strategies and guarantee that LAT longest paths will be shortened in the case of setup violations and EAT shortest paths will be lengthened in the case of hold violations, the effects of aggressor victim interactions involving strength change and movement or just movement alone must be analyzed.

In addition to the above-noted problems and disadvantages of the related art, to make crosstalk mitigation practical and efficient, it is important to limit the scope of the analysis to the immediate neighborhood of the edges on primary and secondary paths. As a result, another problem and/or disadvantage of the related art is that certain strength changes and movements that related art techniques would make should not be allowed, because their effect is not local and cannot be guaranteed to be effective in making desired path length changes.

Interaction Ground Rules

In the present invention, only the setup violation or hold violation for the victim strengthening case is discussed. However, this discussion can easily be extended to other cases by one of ordinary skill in the relevant art.

In general, with the exception of tracing, as will be discussed in greater detail below, the effect of the strength change of $\alpha$ or movement of a $\beta$ on any victims, both victims also moving themselves or stationary victims, must either keep their victims' net LATs constant or reduce their LAT. Also the effect of any aggressors, whether moving themselves or stationary, on $\alpha$ or $\beta$ must keep $\alpha$'s or $\beta$'s net LAT constant or reduce it. It is possible to have aggressors and victims both moving, because the aggressor and victim may both be on the same critical path, or one (e.g., victim) on a first critical path and another (e.g., aggressor) on a secondary path.

Intermediate effects are the effects that aggressors may have on victims that lie between an aggressor and a victim that are both moving. Intermediate effects must in general be quantified, because intermediate effects determine the relative time shifts of aggressor and victim.

Environmental effects are the effects on the net LAT's of victims of all $\beta$s or the victims of the victims of $\alpha$. It also refers to the effect on the victims of the victims of all $\beta$s or victims of victims of $\alpha$ when those victims are regarded as aggressors. As discussed in greater detail below, environmental effects lower LATs or keep LATs at the same level if the interaction between $\alpha$ or $\beta$ and their environments take place. Environmental effects reinforce the shortening of the critical path. Thus, the critical path shortening calculated for strengthening of α and tracking the movements of βs may be augmented by environmental effects. Environmental effects are not quantified. The predictability of environmental effects is consistent with the goal of localizing the effects of changes or predicting the effects of changes that cannot be localized.

The above discussion can be extended to a discussion of EATs. Permitted interactions must cause net EAT to increase or stay the same. Environmental effects also result in constant or increasing EATs.

Tracing

When an interaction between aggressor or victim is disallowed because it does not meet the criteria of the interaction ground rules, the strength change or movement may still be executed by tracing, which is the process of exploring the cone of influence of aggressors acting on victims, and those victims becoming aggressors and acting on their victims. If the interactions at the leaves of the cone of interactions meet the criteria of the interaction ground rules, then the original interaction is permitted. The size of the analyzed cone is referred to as the tracing radius. The tracing radius trades off efficacy for efficiency. For example, but not by way of limitation, a larger radius gives the mitigation algorithm of the present invention more opportunities to find a strength change that meets the criteria of the interaction ground rules.

Aggressor-Victim Interaction Examples

Comprehensive crosstalk mitigation requires addressing of both setup violations and hold violations due to coupling. The cases of aggressor-victim interaction analysis fall into four broad categories: BM (backward movement) slowdown, BM speedup, FM (forward movement) slowdown, and FM speedup. The appropriate analysis depends on what movements are permitted in the context of use and is discussed in greater detail below.

Figure 20:
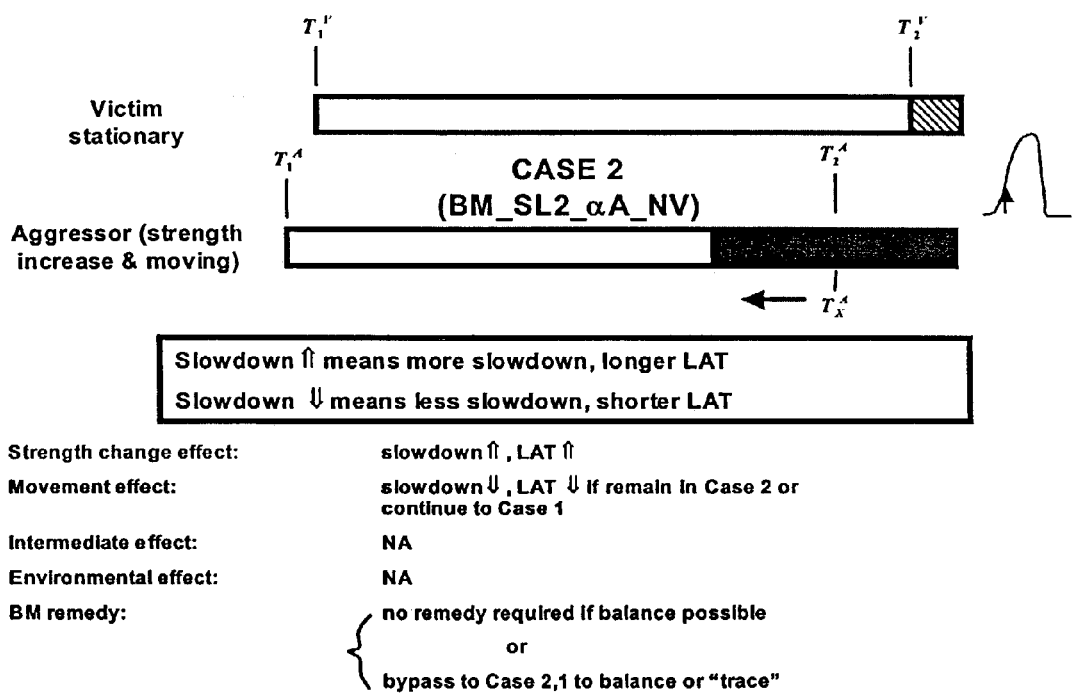
FIG. 20 illustrates a strength change example according to the preferred embodiment of the present invention.

For the case of slowdown, a detailed aggressor victim analysis is done for two cases of BM slowdown analysis in the context of setup violation. FIG. 20 describes Case 2 BM slowdown analysis with α as an aggressor. There are two effects of victim strengthening to consider here: the strength change, which causes slowdown↑ (i.e., more slowdown, longer LAT), LAT↑, and a movement effect due to decrease in the delay of the gate/buffer configuration. The second effect causes slowdown↓ (i.e., less slowdown, shorter LAT), LAT↓ in the Case 2 region of the DCC, since T2 A of the aggressor moves left while the victim is stationary.

Since the aggressor and victim are not both on moving paths, there is no intermediate effect, and environmental effects are limited to non strength change movements (β type movements), environmental effects are not applicable in this case. BM remedy makes the victim-aggressor interaction meet the criteria of the interaction ground rules. If the strength change effect and movement effect cancel each other (i.e., balance) or there is a net decrease in LAT, then the interaction is permitted.

Permission means that the strength increase of this α is allowed to occur, which, as is discussed in greater detail below, allows consideration of βs to begin. If all goes well subsequently, the α strength is allowed to stand. While only single aggressor/victim interactions are discussed here, extension to multiple interactions is discussed in greater detail below.

If balancing does not occur, then tracing is performed. The cone of influence is examined. If all leaves of the cone produce LAT↓ prior to going beyond the tracing radius, then permission is granted.

If tracing cannot be successfully completed, a bypass can be performed. Bypassing involves further strengthening α, so that there is possibly more movement effect to offset the strength change effect, which may or may not produce the desired effect, and depends on the particular nets involved in the interaction. If permission is not finally granted after all three tests, then a new candidate α (if there is one) must be found for crosstalk mitigation to continue.

Figure 21:
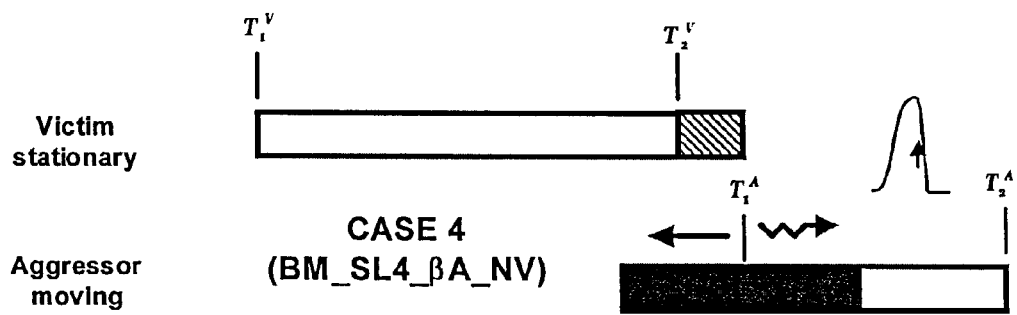
FIG. 21 illustrates a movement only example according to the preferred embodiment of the present invention.
Figure 27:
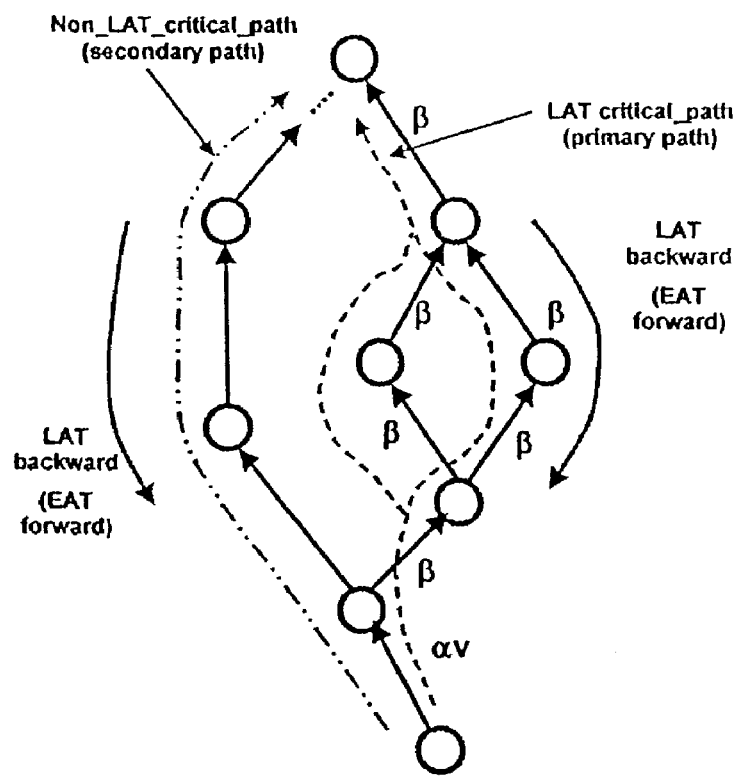
FIG. 27 illustrates a case of victim strengthening for a setup time violation according to the preferred embodiment of the present invention.
Figure 28:
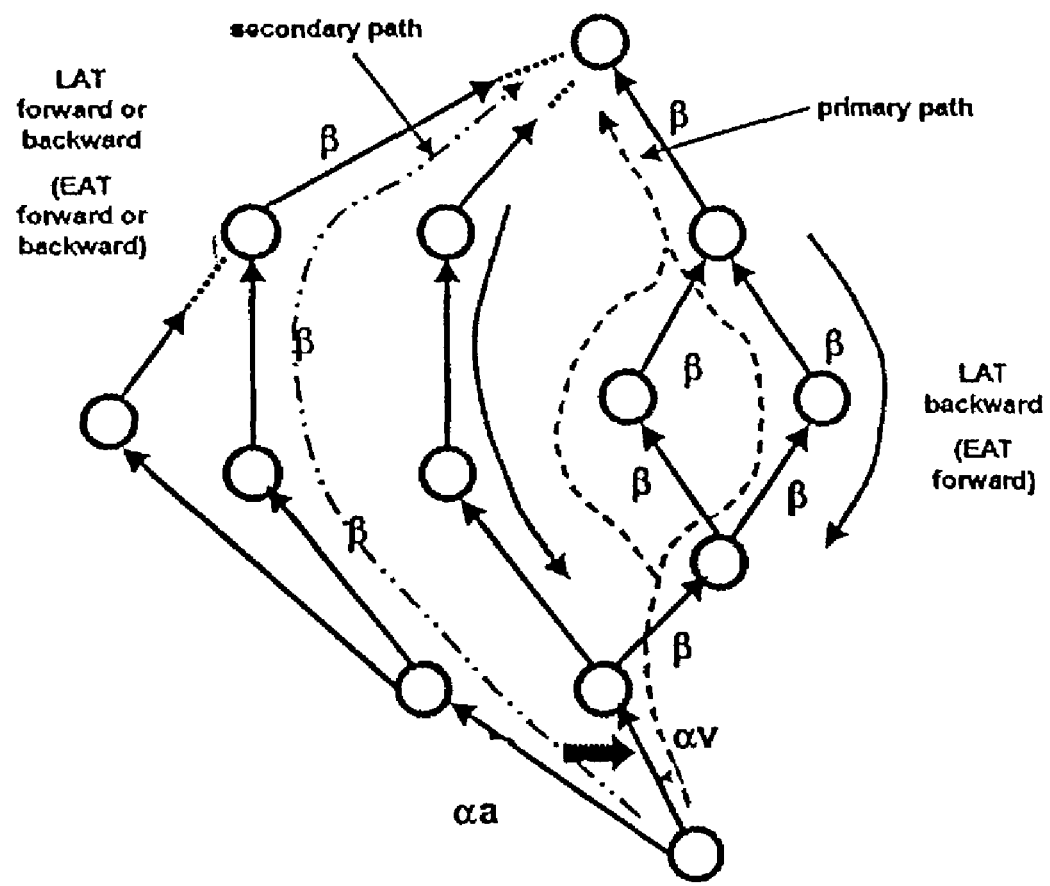
FIG. 28 illustrates a case of aggressor weakening for a setup time violation according to the preferred embodiment of the present invention.
Figure 29:
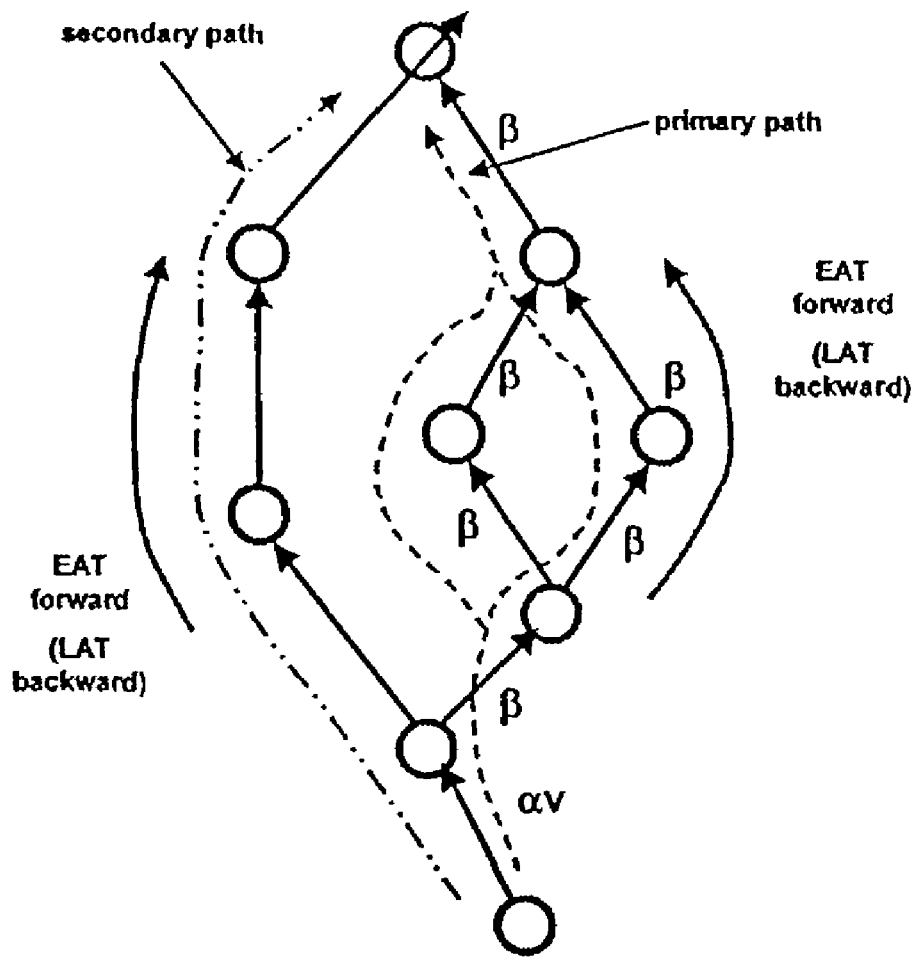
FIG. 29 illustrates a case of victim strengthening for a hold time violation according to the preferred embodiment of the present invention.
Figure 30:
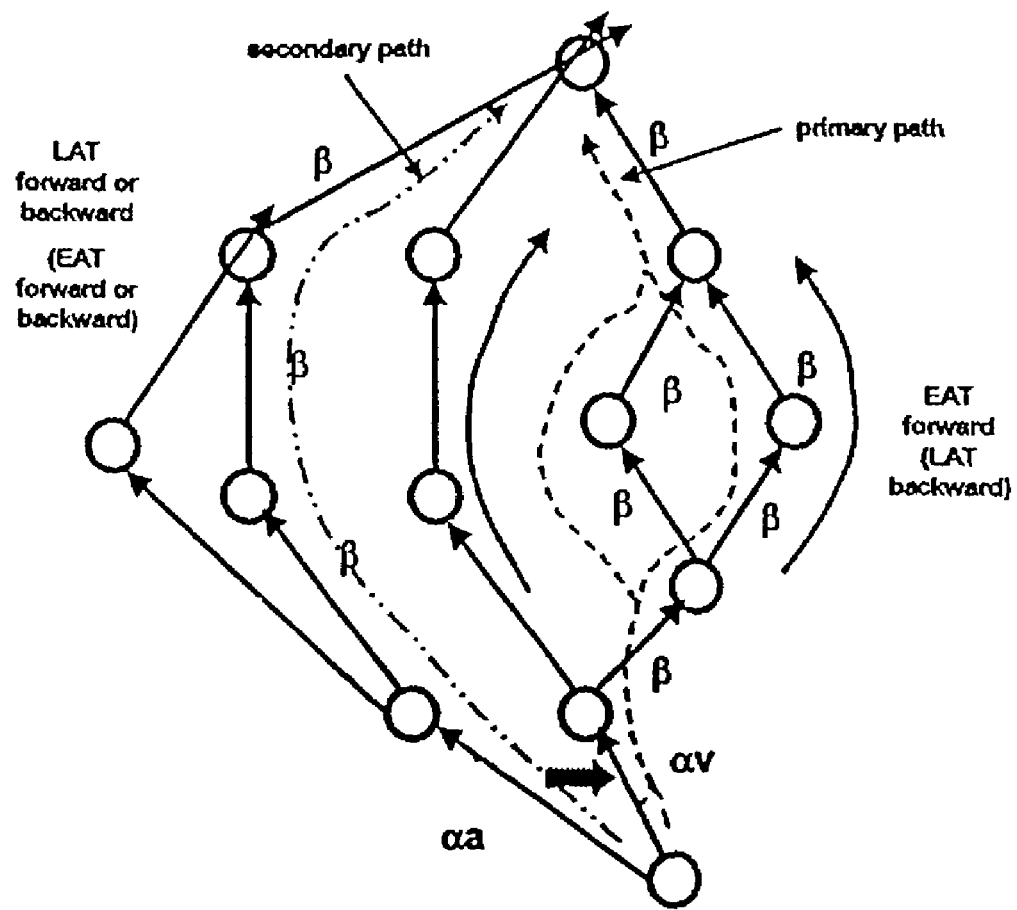
FIG. 30 illustrates a case of aggressor weakening for a hold time violation according to the preferred embodiment of the present invention.

FIG. 21 illustrates Case 4 (BM slowdown analysis) with β as an aggressor. For β type edges there is no strength change effect. Movement produces slowdown↑, LAT↑ if movement remains in Case 4; slowdown constant, no additional LAT change if movement continues to Case 3; slowdown↓ LAT↓ if movement continues on to Case 2 or Case 1. BM remedy is to trace or bypass to Case 2 to achieve a balance. Assuming that balancing cannot be achieved and tracing is unsuccessful, bypassing increases slowdown and then decreases it as the amount of movement of the aggressor increases. It is noted how much additional movement is needed to achieve the balance point where LAT↓. For bypassing to be ultimately successful, it must be possible to increase the strength of α to achieve the needed additional movement.

Speedup analysis comes into play during slowdown analysis. To know the slowdown effect on the victim, a speedup analysis is required for the aggressor. Hence, all algorithms for setup violation mitigation or hold violation mitigation must simultaneously consider both slowdown and speedup.

In speedup analysis, environmental effects cause EAT to remain constant or increase. Hence, as shown in FIG. 21, the environmental effect always causes T1A to increase, which increases separation between T1A and T2V, thus decreasing slowdown and LAT. No environmental remedy is needed.

The aforementioned examples illustrate interactions of aggressors and victims, as discussed in greater detail below, and illustrated in the figures.

Summary of Interaction Case

Summaries of the cases of aggressor-victim interactions described below are presented in FIG. 22 to FIG. 25. FIG. 26 illustrates a summary of abbreviations used in the figures. NRN indicates no remedy needed, which covers most of the cases involving βs. Within brackets is a very short summary of the case where NV(A), DV(A), and UV(A) respectively refer to non-moving victim (aggressor), downstream victim (aggressor) and upstream victim (aggressor). The m, i and e designations refer to movement effects, intermediate effects, or environmental effects. These designations indicate what effect was responsible for the remedy indicated. The entries such as A → and V → indicate the movement by aggressor or victim producing the particular m, i, or e effect. → are upstream movements and ← are downstream movements. The Remedies column of each of FIGS. 22–25 refers to the cases discussed below. Of particular interest are the designations in NREM, meaning normal remedy.

In cases involving α as an aggressor or β as a victim there are designations other than NRN, primarily because there is a strength change involved. BY means bypass or trace as described in the Case 4 BM analysis with β as an aggressor example above. CBY means a conditional bypass or trace as in the Case 2 BM analysis with β as an aggressor example. The COK (conditionally OK or trace) designation means that bypassing is not possible because there is tracking of aggressor and victim, i.e. they are both on moving paths.

The EREM column heading means environmental remedy. It is important to note that there is never any designation other than NRN or NA in the EREM column in any of the summaries. This means that with all possible cases of interaction, there is never a case where environmental interaction does not produce LAT↓ or no change, or EAT↑ or no change.

Static Timing Analysis Implications

After each LAT longest path shortening or EAT shortest path lengthening, a static timing analysis is performed to update timing windows to propagate environmental changes. The changes due to α strength change, all β movements, and all tracing are annotated by the crosstalk mitigation algorithm itself prior to passing the design to STA. Timing analysis in the presence of crosstalk is a "chicken and egg" problem, where slowdown or speedup affects timing windows which in turn affect slowdown or speedup, etc. As a result, changes of the results to the analysis build upon each other. Thus, the changes are performed iteratively, as described with respect to the algorithm below, until the desired end condition is obtained. Given this inherent looping situation in crosstalk aware STA, the crosstalk model assumed must always guarantee convergence.

Since all environmental changes cause LAT↓ or no change, or EAT↑ or no change, timing windows are always shrinking or constant on each iteration of timing analysis. Hence, convergence is guaranteed. The number of iterations required is small, and slew effects are accounted for by using the fastest slew to compute EAT and the slowest slew to compute LAT thus keeping the timing window at worst case (i.e., wide as possible) at each iteration.

The initial timing analysis before any crosstalk mitigation is performed can be done as follows: start with timing windows computed considering worst case crosstalk effects. After the first iteration of considering worst case crosstalk effects, LAT↓ and EAT↑, (i.e. the timing windows shrink because not all interactions will be worst case). Then, the analysis is similar to environmental change as described above, and again static timing analysis will converge.

Crosstalk Mitigation

The algorithm according to the preferred embodiment of the present invention works with the timing graph described above. The timing graph is traversed in the downstream direction (i.e., direction of directed edges in the timing graph) starting at a and ending at latch or flip flop boundaries. All of the moving edges form a cone. During traversal, the effects of crosstalk coupling are calculated. At any point of the algorithm an active edge is being analyzed as an aggressor or victim. The edges interacting with the edge being analyzed can be on parts of the cone that have already been analyzed (i.e. moving but now fixed because their movement has been accounted for), or the edges can be on parts of the cone that have not yet been analyzed. Details of aggressor-victim interaction are discussed in greater detail below, followed by the overall algorithm and complexity estimation.

Aggressor and Victim Analysis

FIG. 27 to FIG. 30 illustrate the victim strengthening and aggressor weakening strategies for both setup and hold violations according to the preferred embodiment of the present invention. The victim strengthening strategies always require that overall dynamic LAT of aggressor ↓ and overall dynamic EAT of aggressor ↑ at α and all βs, which guarantees that the goals of either longest path shortening or shortest path lengthening are always on track. For the aggressor weakening strategy, there are no restrictions on LAT or EAT, because there is always slack on non-critical paths, and either shortening or lengthening can be accommodated.

FIG. 31 to FIG. 34 illustrate the strategies for calculating speedups and slowdowns during execution of the crosstalk mitigation algorithm according to the preferred embodiment of the present invention. When α, the edge whose strength is being modified, is analyzed, the edges that move as a result of the strength change are all in a cone extending from α downstream to the destination end of the timing graph (Downstream_Dummy_Node).

Figure 31:
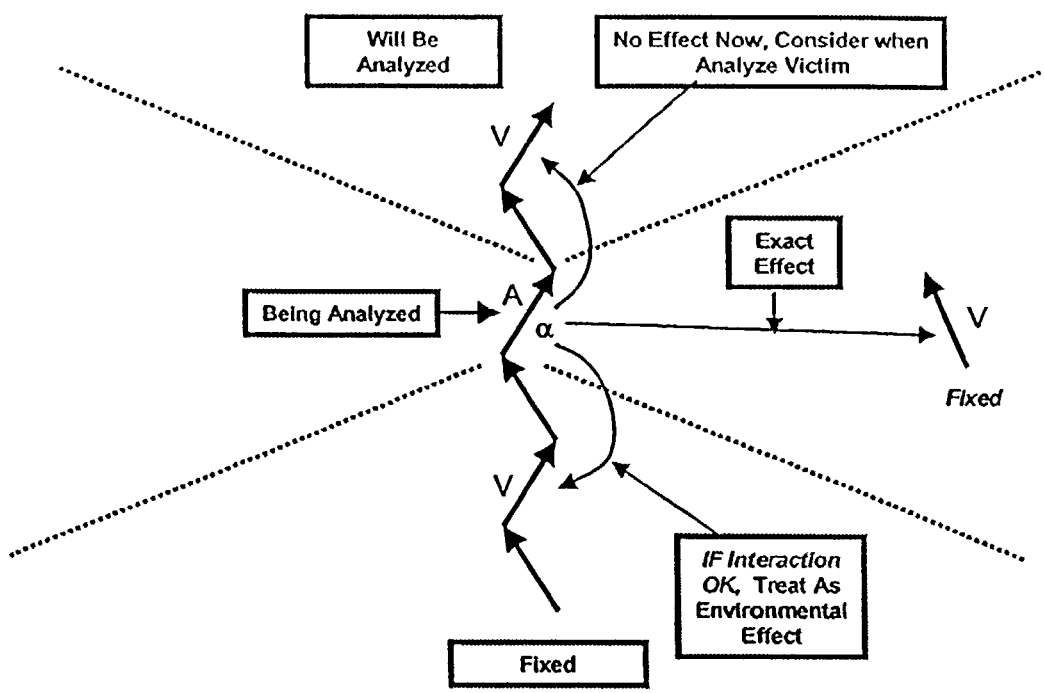
FIG. 31 illustrates an analysis of $\alpha$ as an aggressor according to the preferred embodiment of the present invention.

The effect of α when it is an aggressor, as shown in FIG. 31, on the edges in its cone will be considered when victim analysis is done on those edges. α can be either weakened or strengthened and the movement can be either forward or backward. For fixed edges not in the cone, the exact effect is calculated. For victims earlier on the critical path than α, there is a possibility that bypassing will be required. If so, then another α must be chosen, because bypassing would have no meaning in this context.

If the interaction is of the NRN type, then the effects on the victim are considered to be environmental and are not ignored in the analysis. Of course, an NRN effect for interaction between α and upstream victims just has the effect of shortening LAT longest paths or lengthening EAT shortest paths further.

Figure 32:
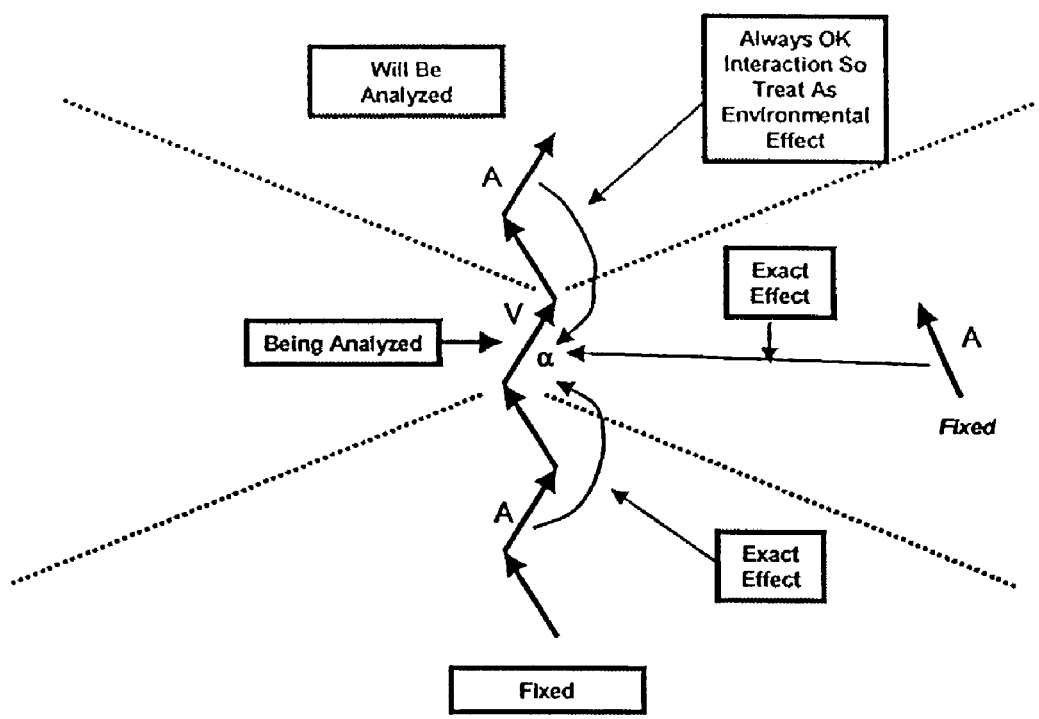
FIG. 32 illustrates an analysis of $\alpha$ as a victim according to the preferred embodiment of the present invention.

When α is a victim as shown in FIG. 32, the interaction between downstream aggressors and α is always type NRN, and since the timing graph is traversed from upstream to downstream, and the intermediate effects are unknown so that the exact skew between aggressor and victim cannot be determined, the interaction is treated as an environmental effect. In the case of an upstream aggressor, the exact effect can be calculated. Bypassing is not needed, as can be seen by consulting the above-referenced tables. The exact effect between fixed (not on cone from α to Downstream_Dummy_Node) aggressors and a can also be calculated.

Figure 33:
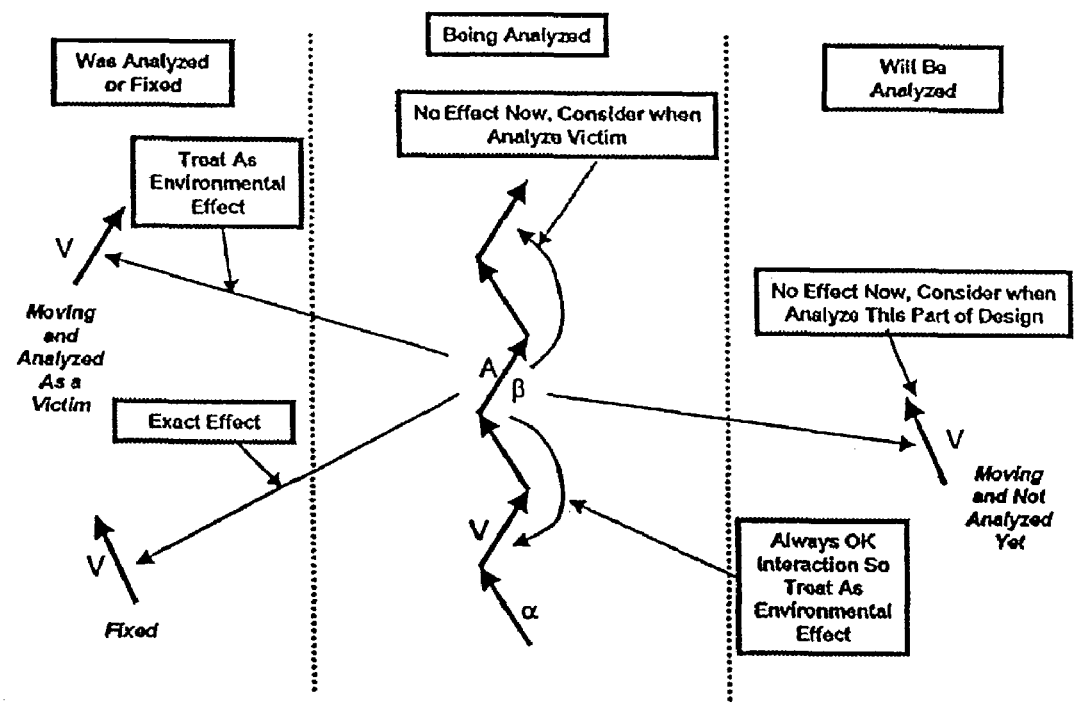
FIG. 33 illustrates an analysis of $\beta$ as an aggressor according to the preferred embodiment of the present invention.

When β is an aggressor, as shown in FIG. 33, interactions with fixed victims use the exact effect. The effect on a victim that has already been analyzed is treated as an environmental effect, and the possible looping of effects is thereby passed off to the subsequent crosstalk aware STA.

Treatment as an environmental effect is acceptable because the common movement and the intermediate effects affecting β's victim have already been accounted for when β's victim was analyzed as an victim previously. Now the only effects that need to be considered are the intermediate effects on the victim's aggressor, i.e. β itself. The intermediate effects acting on β produce LAT↓ and EAT↑ whether the path β is on is a primary or secondary aggressor weakening or primary or secondary victim path. The effect on downstream victims and victims not yet analyzed is handled when these victims are encountered while traversing the cone. The effect on upstream victims is always of type NRN and is treated as an environmental effect.

Figure 34:
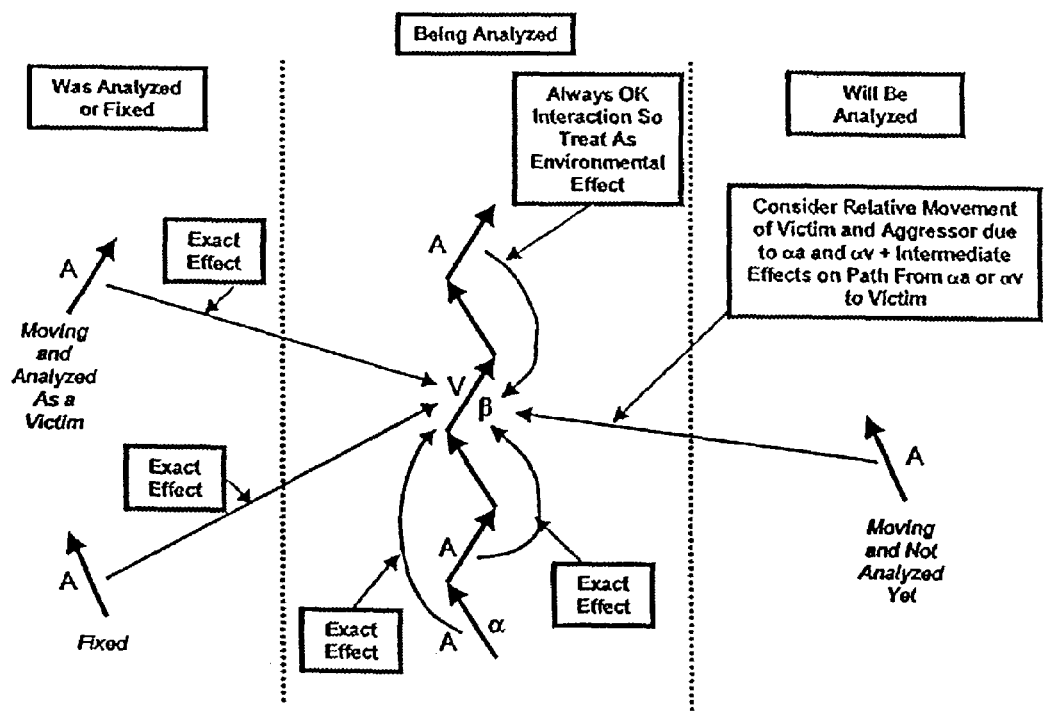
FIG. 34 illustrates an analysis of $\beta$ as a victim according to the preferred embodiment of the present invention.

When β is a victim, as shown in FIG. 34, the exact effect is calculated for all interactions between fixed or previously analyzed aggressors and β. Moving aggressors on paths not yet analyzed are assumed to move at much as the α s stimulating their paths, thereby ignoring the intermediate effects (which are unknown at this point). The intermediate effects will then considered to be an environmental effect then the moving aggressor is analyzed as a victim. Intermediate effects can only be helpful in reaching the desired goals.

Algorithm Description

Figure 50:
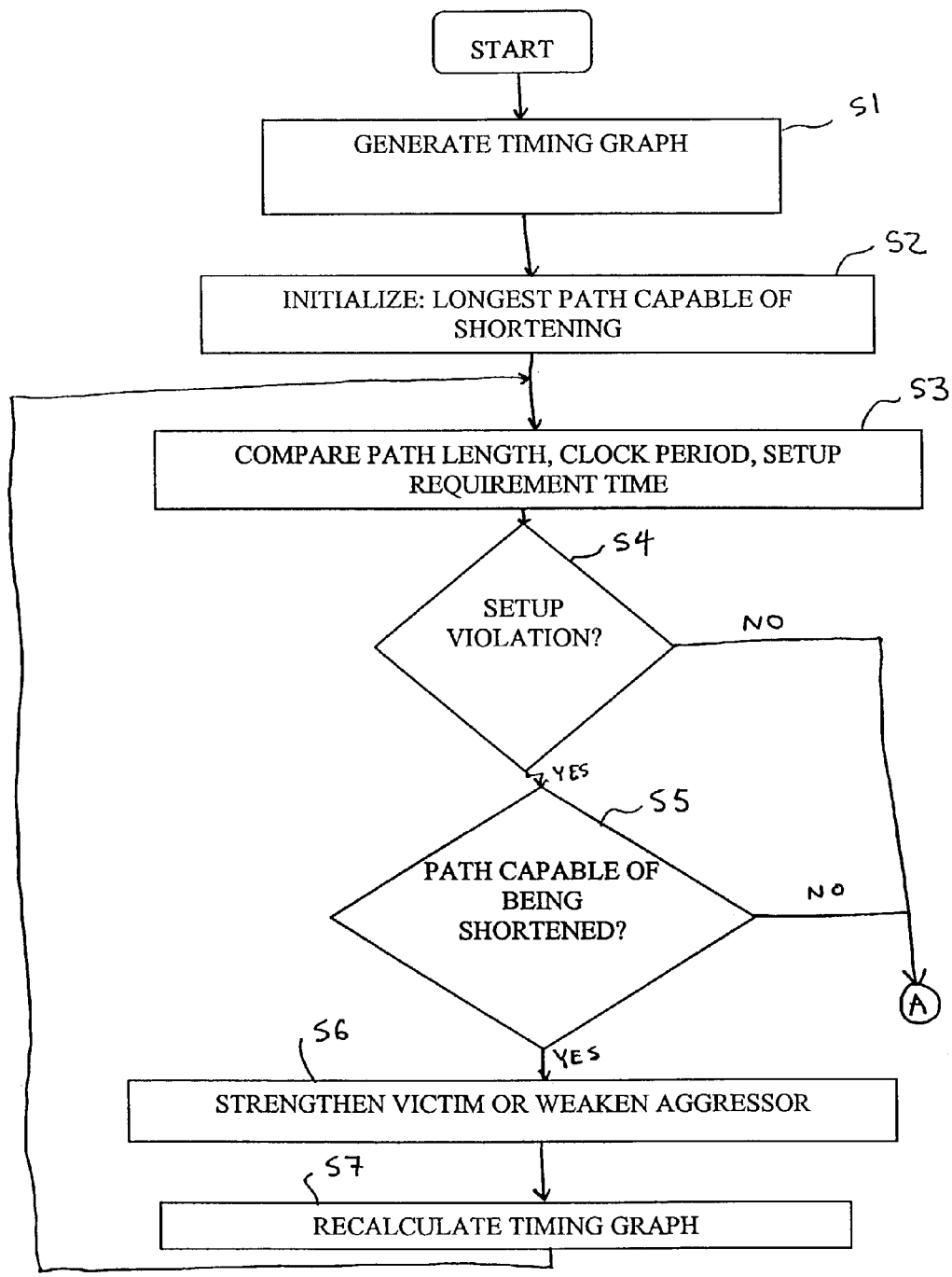
FIGS. 50($a$) and 50($b$) illustrate a method of crosstalk mitigation according to the preferred embodiment of the present invention.
Figure 50B:
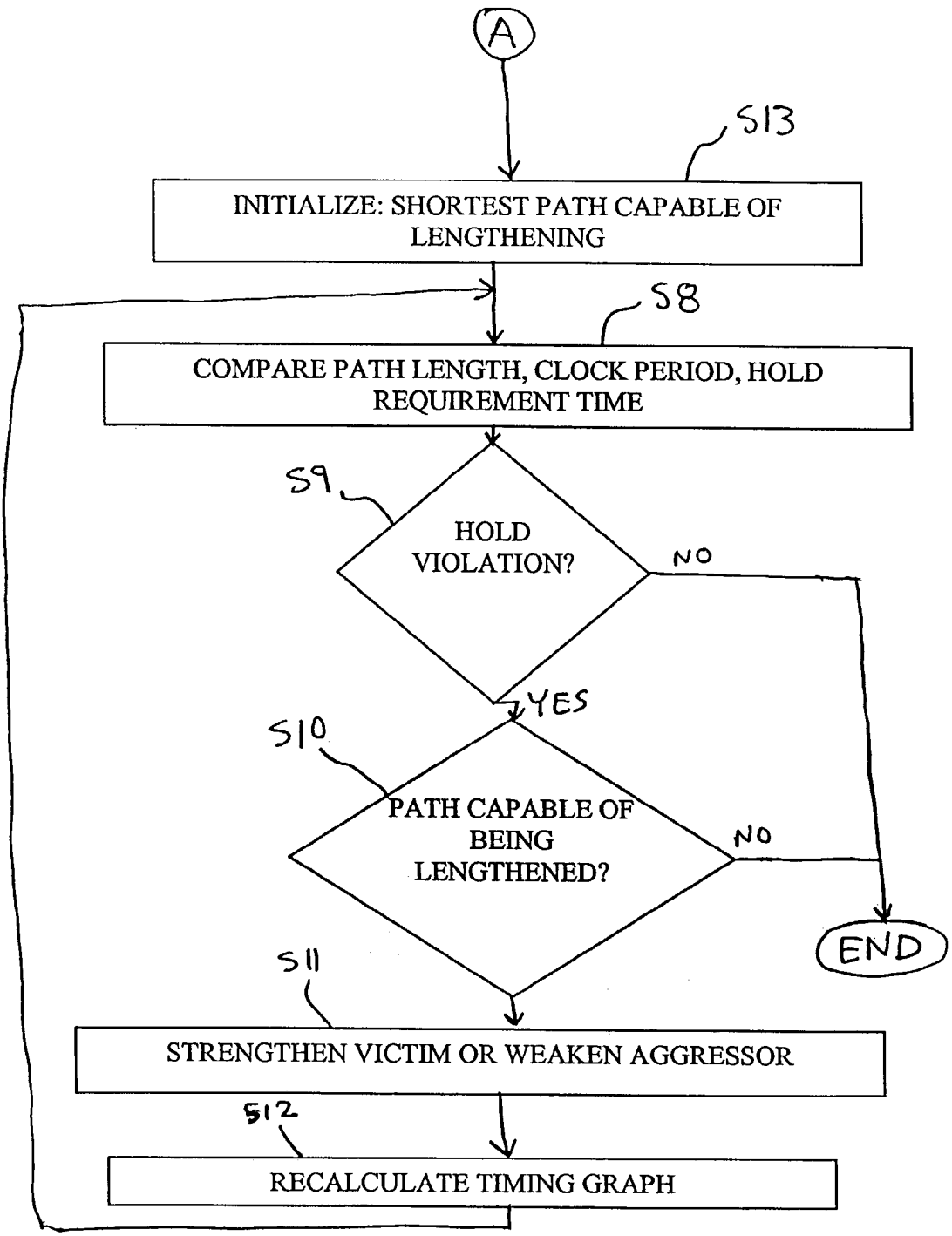

FIGS. 50(a) and 50(b) illustrate a method of mitigating crosstalk according to the preferred embodiment of the present invention. The process starts at the head of the critical path and tries to change each portion of the path. If glitching occurs, then the method cannot mitigate crosstalk. Therefore, the present invention assumes that there is no glitching.

In a first step S1, a timing graph is generated as described above. Next, at step S2, based on the timing graph generated at step S1, an initialization step is performed, wherein the longest path capable of being shortened is calculated. At step S3, path length, clock period and setup requirement time are compared. Once the comparison has been performed, step S4 determines whether a setup requirement time violation has occurred. If not, then the critical path need not be shortened, and steps S8–S13, which are described further below, are performed.

However, if it is determined at step S4 that a setup requirement time violation has occurred, then at step S5, it is determined whether the path is capable of being shortened. If the path is not capable of being shortened, then steps S8–S13 are performed as described further below. However, if the path is capable of being shortened, then at step S6, the victim is strengthened or the aggressor is weakened. Because it is a more direct approach that avoids effects on other paths, victim strengthening is attempted prior to aggressor weakening. With setup requirement time violations, there is a problem is the path is too long. Thus, at step S6, the path is shortened.

At step S7, the timing graph is recalculated based on the changes made in step S6, and steps S3–S7 are performed until there is no setup requirement time violation (i.e., "NO" at step S4), or there is the path is not capable of being farther shortened (i.e., "NO" at step S5). Once either of those events has occurred, then possible path lengthening to handle hold requirement time violations is considered in steps S8–S13, as described below. With hold requirement time violations, there is a problem if the path is too short, so path lengthening is desirable.

In step S13, an initialization step is performed and the shortest path capable of lengthening is determined. Then, at step S8, path length, clock period and hold requirement time are compared. At step S9, it is determined whether there is a hold requirement time violation. If there is no hold requirement time violation, then there will be no need to perform path lengthening, and the method is ended. However, is there is a hold requirement time violation, then step S10 is performed, in which it is determined whether the path is capable of being lengthened. If the path is not capable of being lengthened, then crosstalk has been mitigated as best as is possible, and the process is terminated.

However, if it is determined in step S10 that the path is capable of being lengthened, then, at step S11, path lengthening is performed by victim strengthening or aggressor weakening. For at least the reasons noted above, victim strengthening is attempted prior to aggressor weakening. Once step S11 has been completed, then the timing graph is recalculated to incorporate the changes made at step S11. Steps S8–S12, are then repeated until either step S9 or step S10 is yields an answer of "NO", at which point the method is terminated.

In the above-described method, setup violations are analyzed prior to hold violations because setup violations are more common. Further, the changes made for the setup violations correction will not negatively affect the ability to lengthen the path for hold violations. Also, the present invention takes the two-staged approach, because different choices would be made for a depending on whether setup or hold violations are to be corrected. However, the present invention is not limited to the above-described procedure. For example, but not by way of limitation, the order may be reversed, and/or only hold or setup violation analysis may be performed, and the other violation analysis may be bypassed.

FIG. 35 illustrates the top level procedure, Mitigate_Crosstalk., which first finds the LAT_longest_paths and the EAT_shortest_paths. For both setup and hold violations, loops continue incremental path shortenings or lengthenings until setup or hold time is met, or no legal changes can be made. As noted above, for both setup and hold violations, victim strengthening is attempted first, followed by aggressor weakening, because victim strengthening always reduces delay, whereas aggressor weakening increases delay, which may have to be undone in future iterations to meet goals.

As illustrated in FIG. 36 of the preferred embodiment of the present invention, Look_for_$\alpha$ is called by Mitigate_Crosstalk, to search for candidates for strengthening or weakening, which is used to perform steps S6 and S11. Look_for_$\alpha$ begins its search at the Downstream_Dummy_Node. Thus, the latest edge (i.e., closest to the latch) is considered first, and is considered to be $\alpha$. Since $\alpha$ can never be located between a fork and join, any encountered fork and join is bypassed. Once a candidate for strength change is found (i.e., the edge is not as strong as possible), the smallest strength for victim strengthening (largest strength for aggressor weakening) is chosen that causes overall movement above (below) the current movement_threshold, and is larger (smaller) than the current strength.

Movement_threshold is initially set to zero if victim paths are active or to a large positive number if aggressor weaken paths are active. Movement_threshold increases as the amount of bypassing needed is increased. Bypassing is permitted for victim paths but not aggressor weakening paths, because aggressor weakening paths can have net movement at any point along the path that is either forward or backward, so bypassing would have little meaning in this context. If a strength cannot be found that satisfies the movement_threshold, because either a new glitch victim (aggressor) would be created, or there are just no sizing or buffering alternatives that can create the needed movement, then strength_change_possible is reset.

Strengths are initialized to be the smallest (largest) strength that causes movement that will just cause a new LAT_Longest_Path or EAT_Shortest_Path to form, depending on whether setup violations or hold violations are active. Assuming that a strength change is possible, $\alpha$ is evaluated as both an aggressor and victim.

Next, traversal of the cones is begun. If the strategy is Weaken_Aggressor then the cone beginning at $\alpha$a is analyzed by Evaluate_$\alpha$_As_Victim (see FIG. 38). This cone is analyzed before the cone associated with the victim because secondary paths can shorten or lengthen and affect the ability of the primary paths to reach their goals where the secondary path and primary paths join.

After the weaken_aggressor cone is analyzed (if there is one), the cone beginning at $\alpha$v is analyzed. Then, if traversal is successful ($\beta$_proceed=TRUE), the strength change at $\alpha$ and the movements at $\beta$s meet the criteria of the interaction ground rules, and a shortening of longest paths or lengthening of shortest paths is guaranteed.

As shown in FIG. 37, Evaluate_$\alpha$_As_Aggressor follows the procedures outlined in FIG. 31 to determine the interaction between $\alpha$ and its victims, according to the preferred embodiment of the present invention. Both dynamic EAT and LAT are updated. The detailed technique for accounting for the accumulated effects of multiple aggressors on a single victim is beyond the scope of this paper, and the crosstalk mitigation algorithm is not dependent on one technique or another. For the purposes of this paper, a simple superposition of the effects can be assumed.

A segment of pseudocode that appears in several procedures is encountered after it is determined that all aggressors that have moved for a particular victim have been encountered. Tracing is performed as described above. As illustrated in FIG. 44, the Trace procedure first determines the LAT and EAT dynamic delay change on a particular victim due to the movement and/or strength change of the current aggressor. If these changes produce a net change of LAT↓ and EAT↑, then tracing has been successful and continued tracing along the current subtree of the trace tree can terminate.

If LAT↑ or EAT↓, then there must be enough slack on the edge to absorb the changes without affecting downstream edges. If interaction with downstream edges were allowed, then tracing would become much more complex and could involve a large part of the remainder of the circuit. If there is enough slack, then tracing can continue examining the current subtree and other subtrees, otherwise tracing has failed entirely.

Returning to Evaluate_αAs_Aggressor, if tracing was successful then no bypassing is needed to accommodate the current victim and the other victims of α can be examined. However, if bypassing is needed, then the movement_threshold must be updated by Update_Movement_Threshold, as shown in FIG. 43.

For each aggressor of a victim, Update_Movement_Threshold finds the amount of bypass needed and changes the movement_threshold to achieve this. If the case analysis of FIG. 22 to FIG. 25 produces a BY or CBY determination, then further movement will cause LAT↑ or EAT↓. However, by bypassing to the opposite side of the DCC curve, further movement causes LAT↓ or EAT↑, the desired effect. Since the overall effect on a victim is a superposition of the effects of individual aggressors, improving the situation involves increasing overall α movement so LAT↓ or EAT↑ as a result of those interactions that are NRN or by bypassing for those interactions that are BY or CBY.

Update_Movement_Threshold first orders the interactions producing BY or CBY by smallest to largest bypass required. Then those movements are simulated and the overall effect on LAT and EAT calculated until the desired effect is obtained. This may be more total movement than needed and a backtracking step, Binary_Search_For_Movement_Threshold is performed to get exactly the minimum amount of movement needed to get a minimal LAT↓ or EAT↑.

As shown in FIG. 38, Returning to Look_for_α, Evaluate_α_As_Victim follows the procedures outlined in FIG. 32 to determine the interaction between α and its aggressors. If overall LAT↓ or EAT↑ then tracing and possibly movement_threshold updating is performed.

Evaluate_β_Path proceeds downstream from α evaluating βs as it goes. If a fork is encountered, the node where forking occurs is stored in a stack. All secondary paths are explored first and then primary paths. Among secondary paths, the choice is arbitrary.

As shown in FIGS. 39 and 40, within Evaluate_β_Path, Evaluate_β_As_Victim follows the procedures outlined in FIG. 34 to determine the interaction between β and its aggressors. If overall LAT↑ or EAT↓ then tracing and possibly movement_threshold updating is performed.

Returning to Evaluate_β_Path, if evaluation of β as a victim has succeeded and no bypassing is required, Evaluate_β_As_Aggressor is called to finish looking at this β. This procedure implements the procedures outlined in FIG. 33 and again, tracing and possibly movement_threshold updating is performed. Next_Unexplored_Edge is called to determine if β evaluation should continue. If β is NULL, then the Downstream_Dummy_Node has been reached and the path has terminated successfully and α movement can be sustained. The path can also be terminated if the slack available at the destination node of β cannot support the full movement needed by β (See Slack_Terminate_Path as illustrated in FIG. 45). If this is the case, then there can be no transmission of β movement downstream and no need to check more βs. This will still result in some critical path change and so is considered a successful conclusion. Evaluate_β_Path then successfully returns to Look_for_α.

Even though the strength of β is not changing, it is still moving, and thus has an effect on other things as an aggressor, and is also affected as an aggressor. Thus, β is evaluated for victim and aggressor separately. The same separate evaluation principle applies to α as well.

In Look_for_α if no bypassing was necessary for βs, this procedure returns successfully. If no strength change can be legally performed on α or in the search for a new α the Upstream_Dummy_Node was encountered, Look_for_α returns unsuccessfully. If bypassing was needed and the α strength change was able to be executed, then another round of evaluating βs begins with a new movement amount.

Algorithm Complexity

Complexity of Mitigate_Crosstalk is illustrated in FIG. 46. The bulk of the complexity lies in checking βs. When bypassing is required on a critical path, no amount of movement less than that will satisfy the criteria of the interaction ground rules. Since the number of sizings of α is limited to less than about 10, then at most approximately 10 β checkings are needed. Combining this observation with the fact that βs are always in a cone off the critical path, and that frequently slack limitations will stop β movements and terminate further size changes means that complexity is likely to be less than that estimated. Also, slack limitations will increase in probability as α sizes up or down.

Application of Mitigate Crosstalk

Figure 47:
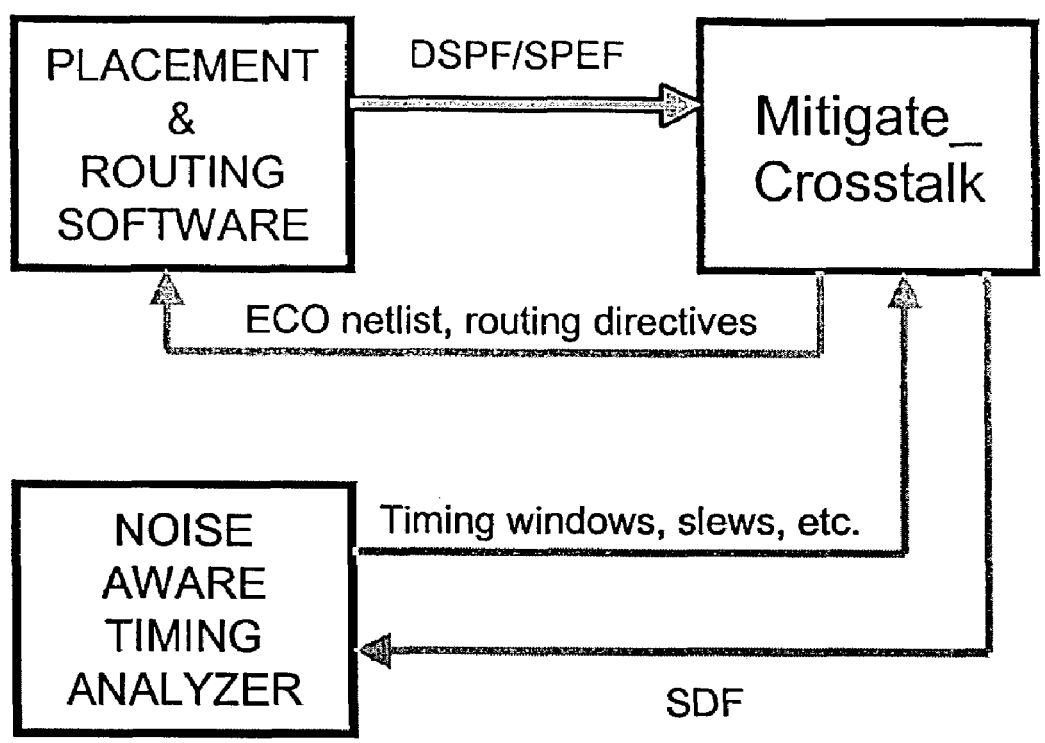
FIG. 47 illustrates an application according to the preferred embodiment of the present invention.
Figure 48:
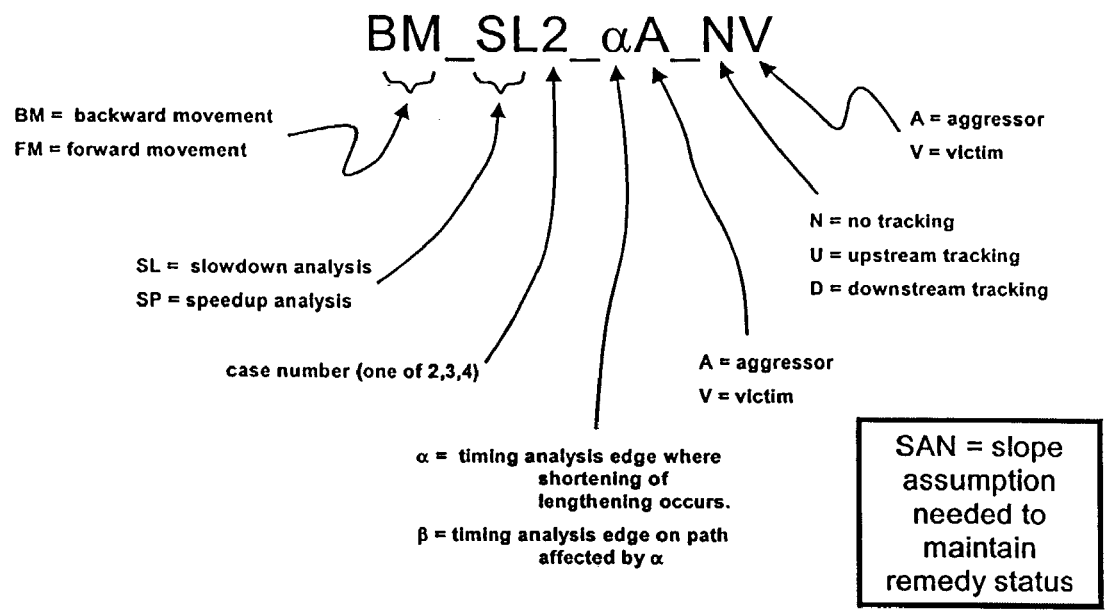

FIG. 47 shows an application of Mitigate_Crosstalk. As discussed above, possibly several calls to crosstalk aware static timing analysis may be needed to update timing windows after Mitigate_Crosstalk has shortened or lengthened the critical path. Any convenient format can be used for communication between Mitigate_Crosstalk and timing analysis, although SDF is currently an industry standard for interchanging timing information.

After it is determined how buffering or gate sizing has to change, this information can be transmitted to placement and routing tools by engineering change orders (ECOs). The layout information necessary for determining wire net length and coupling can be transmitted using DSPF or SPEF, two industry standards for interchanging such information.

Advantages

The present invention has various advantages over the related art. For example, but not by way of limitation, the present invention is superior to related art blanket approaches based on noise balancing, because specific paths affected by delay uncertainty are targeted for mitigation. Further, the present invention guarantees that mitigating changes will be effective in reducing delay in setup violation cases and increasing delay in hold violation cases. The present invention also guarantees that side effects due to mitigation will always produce an improvement or no change in mitigation.

Knowledge of critical paths can be used to pinpoint which aggressors should be weakened and victims strengthened and by how much their strengths should be changed considering the effects on the entire critical path and secondary paths. That methodology has a twofold advantage. First, by concentrating on critical paths, the size of the problem is reduced, as the computational resources otherwise required to produce unnecessary and ineffective strength changes using the blanket approach are not wasted. Second, each strength change is guaranteed to move toward the desired goal, or it is not executed. In contrast, the related art blanket changes are not guaranteed to move toward the goal.

Additionally, knowledge of the exact slowdown and speedup effect due to relative switching times of the aggressor and victim by applying DCC curves to crosstalk mitigation yields a more accurate solution than related art switch factor estimates of delay.

Further, the novel modified DCC curves increase the likelihood of finding an acceptable victim strengthening or aggressor weakening. Modified DCC curves also make possible a small set of interaction rules, thereby easing the burden of software generation as yet another advantage of the present invention. Modified DCCs also guarantee that an exact victim and aggressor position can be determined that gives a worst case slowdown or speedup scenario.

Additional advantages of the present invention include reduction of processing requirements for crosstalk mitigation that are based on the need to calculate other non-critical paths. Also, there is an improved rate of correction over the blanket method because each use of the method is guaranteed to move closer to the intended goal.

It will be apparent to those skilled in the art that various modifications and variations can be made to the described preferred embodiments of the present invention without departing from the spirit or scope of the invention. For example, but not by way of limitation, buffer insertion is not a part of the preferred embodiment of the present invention. However, as an alternate embodiment of the present invention, buffer insertion is used for victim strengthening (i.e., splitting the line into segments each driven by a buffer). Similarly, removal of buffers is used for aggressor weakening. The previously described methods for determining acceptable victim strengthenings or aggressor weakenings can be applied to individual buffer driven line segments. Thus, it is intended that the present invention cover all modifications and variations of this invention consistent with the scope of the appended claims and their equivalents.

What is claimed is:

1. An integrated circuit, comprising:
   a first line having a first signal;
   a second line having a second signal, wherein there is substantially simultaneous switching of the said first and said second signal causing crosstalk, and wherein the resulting crosstalk is mitigated by shortening a longest path or lengthening a shortest path,
   a timing graph having a plurality of input gates coupled by connections configured to determine a longest path that it is available to be shortened in said timing graph; and
   a selected path having a length that is compared to a setup time and a clock period, wherein said longest path is shortened by one of strengthening a victim on the selected path or weakening an aggressor if a setup time violation exists for said selected path and said selected path it is available to be shortened.

2. The integrated circuit of claim 1, wherein said shortening of said longest path or said lengthening of said longest path is based on a delay change curve (DCC).

3. The integrated circuit of claim 1, further comprising:
   a selected path having a length that is compared to a clock period and a hold requirement time, wherein a shortest path is lengthened by one of strengthening a victim on said selected path or weakening an aggressor if a hold requirement time violation exists for said selected path and said selected path it is available to be shortened.

4. The integrated circuit of claim 1, wherein targeted transistor sizing and/or buffer insertion is used for said mitigation of said crosstalk.

5. The integrated circuit of claim 1, further comprising a limited number of gates and connections requiring examination to mitigate crosstalk.

* * * * *

UNITED STATES PATENT AND TRADEMARK OFFICE
CERTIFICATE OF CORRECTION

| | |
|---|---|
| PATENT NO. | : 7,111,259 B2 |
| APPLICATION NO. | : 10/457563 |
| DATED | : September 19, 2006 |
| INVENTOR(S) | : Albert E. Casavant |

Page 1 of 1

It is certified that error appears in the above-identified patent and that said Letters Patent is hereby corrected as shown below:

Title Page, item [73] should read
--Assignee: NEC Corporation, Tokyo (JP)--

Signed and Sealed this

Twenty-third Day of October, 2007

JON W. DUDAS
*Director of the United States Patent and Trademark Office*